United States Patent
Takahashi et al.

(10) Patent No.: US 7,981,816 B2
(45) Date of Patent: Jul. 19, 2011

(54) IMPURITY-ACTIVATING THERMAL PROCESS METHOD AND THERMAL PROCESS APPARATUS

(75) Inventors: Kazuma Takahashi, Hyogo (JP); Kenji Yoneda, Kyoto (JP)

(73) Assignee: Panasonic Corporation, Osaka (JP)

( * ) Notice: Subject to any disclaimer, the term of this patent is extended or adjusted under 35 U.S.C. 154(b) by 65 days.

(21) Appl. No.: 12/363,225

(22) Filed: Jan. 30, 2009

(65) Prior Publication Data

US 2009/0197428 A1 Aug. 6, 2009

(30) Foreign Application Priority Data

Feb. 6, 2008 (JP) ................. 2008-026939

(51) Int. Cl.
*H01L 21/425* (2006.01)
*H01L 21/26* (2006.01)
*H01L 21/42* (2006.01)
*H01L 21/00* (2006.01)

(52) U.S. Cl. ........ 438/799; 438/530; 438/535; 438/795; 438/796; 438/797

(58) Field of Classification Search .................. 438/530, 438/535, 795–799
See application file for complete search history.

(56) References Cited

U.S. PATENT DOCUMENTS

| | | | |
|---|---|---|---|
| 6,770,519 B2 | 8/2004 | Ito et al. | |
| 7,026,205 B2 | 4/2006 | Ito et al. | |
| 7,629,275 B2 * | 12/2009 | Chen et al. | 438/799 |
| 2004/0018702 A1 | 1/2004 | Ito et al. | |
| 2006/0094178 A1 * | 5/2006 | Lin et al. | 438/197 |
| 2009/0004805 A1 * | 1/2009 | Nandakumar et al. | 438/306 |

FOREIGN PATENT DOCUMENTS

JP 3699946 9/2005

OTHER PUBLICATIONS

Quirk et al. Semicondcutor Manufacturing Technology, 2001, Prentice Hall, Inc. Upper Saddle River, NJ. pp. 500-501.*

* cited by examiner

*Primary Examiner* — Michael S Lebentritt
*Assistant Examiner* — Karen M Kusumakar
(74) *Attorney, Agent, or Firm* — McDermott Will & Emery LLP

(57) ABSTRACT

An impurity-activating thermal process is performed after a target is subjected to an impurity introduction step. In this thermal process, while a spike RTA process including a holding period for holding a temperature at a predetermined temperature is performed, at least one iteration of millisecond annealing at a temperature higher than the predetermined temperature is performed during the holding period of the spike RTA process.

6 Claims, 12 Drawing Sheets

IMPURITY-ACTIVATING THERMAL PROCESS METHOD AND THERMAL PROCESS APPARATUS

CROSS REFERENCE TO RELATED APPLICATION

This application claims priority under 35 U.S.C. §119 on Patent Application No. 2008-26939 filed in Japan on Feb. 6, 2008, the entire contents of which are hereby incorporated by reference.

BACKGROUND OF THE INVENTION

1. Field of the Invention

The present invention relates to a method for manufacturing a semiconductor device and, more particularly, to an impurity-activating thermal process method after impurity introduction, and a thermal process apparatus for carrying out the method.

2. Description of the Background Art

In recent years, devices have been downsized along with the increase in the degree of integration, functionality and speed of semiconductor integrated circuit devices. Accordingly, progress has been made not only with lateral miniaturization, e.g., a reduced gate length of a transistor, but also with vertical miniaturization, e.g., an ultra-thin gate insulating film. Particularly, in a transistor, the impurity diffusion in the lateral direction (the channel direction) from a source/drain region and an extension region into a channel region and the impurity diffusion in the depth direction are severely restricted. This is because the short channel effect deteriorates if the impurity diffusion length in the channel direction of a transistor and the impurity diffusion depth in the depth direction thereof increase. On the other hand, there is also a demand for a reduction in resistance of these extension and source/drain regions, with the impurity diffusion length and the impurity diffusion depth being suppressed. This is because if the resistance of the extension region is reduced, the parasitic resistance from the source/drain region to the channel region is reduced, thereby obtaining a higher drive power.

Thus, there is a demand for the extension region to have a reduced resistance while suppressing the impurity diffusion length. While increasing the impurity concentration and performing a thermal process adequately are effective for obtaining a low resistance, they also lead to an increase in the impurity diffusion length. Therefore, the reduction in the diffusion length of the extension region and the reduction in the resistance thereof are in a trade-off relationship.

In order to solve this problem, an impurity introduction step employs a method in which the ion implantation energy is set to a very low level of 1 keV or less to thereby suppress the impurity introduction depth in a conventional impurity introduction process using an ion implantation method. As to the thermal process step (impurity-activating thermal process step), high-temperature, short annealing based on RTP (Rapid Thermal Processing) has been employed, instead of conventional long annealing using an electric furnace, as a way to improve the activation rate while suppressing the diffusion length. Particularly, in recent years, the impurity-activating thermal process step has been performed by a high-temperature, very short annealing called a "spike RTA", wherein the temperature-increasing/decreasing rate ($\Delta t$) is set to about 100 to 250° C./sec (500° C./sec or less), and the holding period (the thermal process time t) for which the temperature is held at the thermal process temperature (the target temperature being 1000 to 1200° C. in practice) is set to 0 sec (50 msec to 1 sec in practice). FIG. 14A shows an example of a temperature sequence in spike RTA. In spike RTA, the target temperature is set to be high to thereby improve the impurity activation rate and to thus reduce the resistance value, while the thermal process time is set to a very short period of time of 1 sec or less to thereby suppress the impurity diffusion.

With recent very small devices however, it is difficult, even with spike RTA, to improve the activation rate while suppressing the impurity diffusion. Specifically, while a thermal process at a higher temperature is required for improving the activation rate, it is not possible to sufficiently suppress the impurity diffusion with the thermal process time being on the order of 10 to 100 msec in spike RTA.

Therefore, millisecond annealing has recently been drawing attention instead of spike RTA. FIG. 14B shows an example of a temperature sequence in millisecond annealing. As shown in FIG. 14B, in millisecond annealing, the thermal process time t is substantially shortened from 1 μsec to 100 msec at maximum as compared with spike RTA (the thermal process time t: 50 msec to 1 sec) to thereby suppress the impurity diffusion, and a very high temperature-increasing/decreasing rate $\Delta t$ of about $1 \times 10^{6\circ}$ C./sec (note that $\Delta t$ is about $1 \times 10^{7\circ}$ C./sec or less) is used to thereby allow for a very short process at a high temperature (1000 to 1400° C. in practice). With such a millisecond annealing, it is possible to realize a short thermal process at a higher temperature, thereby reducing the impurity diffusion length while improving the activation rate. Generally, three methods of millisecond annealing have been proposed in the art. The first is a method in which the entire surface of a silicon wafer is heated simultaneously and directly by short-wavelength light near visible light using a flash lamp or an arc lamp as the light source (heat source). The second is a method in which a wafer is heated over a limited zone at a time by a short-wavelength pulsed laser such as an excimer laser, and the heated zone is shifted over time in a step and repeat manner to thereby eventually heat the entire wafer surface. The third is a method in which a wafer and a laser beam in the near infrared to infrared range are moved with respect to each other so as to scan and heat the entire wafer surface. While these millisecond annealing methods may each be used alone as an impurity-activating thermal process method, it is sometimes difficult to form an intended diffusion profile with the impurity diffusion being overly suppressed by millisecond annealing as described above. In view of this, also proposed in the art is a method in which a spike RTA or regular RTA process is performed successively before or after millisecond annealing (see Patent Document 1).

Patent Document 1: Japanese Patent No. 3699946

SUMMARY OF THE INVENTION

Even with such millisecond annealing, it is necessary to further increase the thermal process temperature in order to further improve the activation rate. With millisecond annealing, however, the thermal process temperature is already high (normally about 1250 to 1350° C.), as compared with spike RTA and regular RTA, because of the short process time. This is because millisecond annealing performed at a similar temperature to that of spike RTA, e.g., about 1100° C., will not be effective with the short thermal process time. In view of this, millisecond annealing is sometimes performed at a thermal process temperature of a sub-melt region close to the silicon melting temperature (1412° C.) such as about 1300 to 1350° C. Thus, with millisecond annealing being already performed at such a high temperature, it is impossible in principle to further increase the temperature, thereby restricting further improvements in the activation rate.

In view of the problems described above, it is an object of the present invention to provide an impurity-activating thermal process method, with which it is possible to further improve the activation rate without increasing the impurity diffusion length, and to provide a thermal process apparatus for carrying out the same.

In order to achieve the object set forth above, it is currently believed that it is effective to combine spike RTA and millisecond annealing with each other. However, the present inventors have found that the following problems occur with the combination of spike RTA and millisecond annealing.

First, where millisecond annealing is performed after spike RTA, an interface state occurs at the interface between the substrate and the gate insulating film because the millisecond annealing process temperature is high.

Where spike RTA is performed after millisecond annealing, the interface state problem does not occur, but the impurity may be inactivated to thereby lower the drive power, and the impurity may diffuse during spike RTA along defects that have occurred in millisecond annealing, whereby it is difficult to suppress the impurity diffusion, which is the original purpose of the process.

Based on these findings, the present inventors have arrived at the present invention, in which spike RTA and millisecond annealing are performed at the same time using at least two different heat sources, whereby it is possible to further improve the impurity activation rate while solving problems that occur when spike RTA and millisecond annealing are performed separately.

Specifically, a first impurity-activating thermal process method of the present invention is an impurity-activating thermal process method, including an impurity-activating thermal process after a target is subjected to an impurity introduction step, wherein while a spike RTA process including a holding period for holding a temperature at a predetermined temperature is performed, at least one iteration of millisecond annealing at a temperature higher than the predetermined temperature is performed during the holding period of the spike RTA process.

With the first impurity-activating thermal process method of the present invention, during the holding period of spike RTA for holding the temperature at the predetermined temperature for spike RTA, millisecond annealing at a temperature higher than the predetermined temperature is performed, with the impurity diffusion length being controlled by the predetermined temperature, whereby it is possible to improve the impurity activation rate by millisecond annealing without increasing the impurity diffusion length as controlled by the predetermined temperature for spike RTA. In the impurity-activating thermal process for forming the source/drain region. etc., it is possible to maximize the impurity activation rate while suppressing the increase in the crystal defects and the interface state density, thus improving the transistor capability.

A second impurity-activating thermal process method of the present invention is an impurity-activating thermal process method, including an impurity-activating thermal process after a target is subjected to an impurity introduction step, the impurity-activating thermal process including: a first thermal cycle, including: increasing a temperature from an initial temperature to a first predetermined temperature at an arbitrary temperature-increasing rate; increasing the temperature from the first predetermined temperature to a second predetermined temperature at a first temperature-increasing rate; holding the temperature at the second predetermined temperature for a first holding period of 50 msec to 1 sec, both inclusive; decreasing the temperature from the second predetermined temperature to the first predetermined temperature; and decreasing the temperature from the first predetermined temperature to a final temperature; and a second thermal cycle, including: increasing the temperature from the second predetermined temperature to a third predetermined temperature at a second temperature-increasing rate; holding the temperature at the third predetermined temperature for a second holding period of 1 µsec to 50 msec, both inclusive; and decreasing the temperature from the third predetermined temperature to the second predetermined temperature, wherein at least one iteration of the second thermal cycle is performed during the first holding period of the first thermal cycle for holding the temperature at the second predetermined temperature.

With the second impurity-activating thermal process method of the present invention, during the holding period for holding the temperature at the second predetermined temperature, a thermal process at the third predetermined temperature higher than the second predetermined temperature is performed with the impurity diffusion length being controlled by the second predetermined temperature, whereby it is possible to improve the impurity activation rate by the thermal process at the third predetermined temperature without increasing the impurity diffusion length as controlled by the second predetermined temperature. In the impurity-activating thermal process for forming the source/drain region, etc., it is possible to maximize the impurity activation rate while suppressing the increase in the crystal defects and the interface state density, thus improving the transistor capability.

In one embodiment, the second impurity-activating thermal process method of the present invention includes, before performing the first thermal cycle: forming an isolation region on a silicon substrate being the target; subjecting the silicon substrate to an impurity introduction for threshold control; forming a gate electrode on the silicon substrate with a gate insulating film interposed therebetween; forming an offset spacer on a sidewall of the gate electrode; implanting ions of an impurity into the silicon substrate using the gate electrode and the offset spacer as a mask to thereby form an extension region; performing a first activation thermal process for activating the impurity in the extension region; forming a sidewall spacer on the sidewall of the gate electrode with the offset spacer interposed therebetween; and implanting ions of an impurity into the silicon substrate using the gate electrode, the offset spacer and the sidewall spacer as a mask to thereby form a source/drain region.

In one embodiment of the second impurity-activating thermal process method of the present invention, it is preferred that the first predetermined temperature is 350° C. to 650° C., both inclusive; the second predetermined temperature is 650° C. to 1150° C., both inclusive; and the third predetermined temperature is 1150° C. to 1400° C., both inclusive. In other words, the first predetermined temperature is a temperature in such a range that free carrier absorption occurs in the silicon substrate, which therefore becomes substantially opaque to infrared wavelengths (thus absorbing infrared radiation). The second predetermined temperature is a temperature in such a range that it is possible to control the impurity diffusion length and to repair damages incurred by ion implantation. The third predetermined temperature is a temperature in a range from such a temperature (1150° C.) that it is possible to improve the impurity activation rate to a temperature (1400° C.) less than or equal to the melting point of silicon (1412° C.).

In one embodiment of the second impurity-activating thermal process method of the present invention, it is preferred that the first temperature-increasing rate is 100° C./sec to 1000° C./sec, both inclusive; and the second temperature-increasing rate is 1000° C./sec to $1.0\times10^{7}$° C./sec, both inclusive. In other words, the first temperature-increasing rate is a temperature-increasing rate in such a range that it is possible to suppress the transient enhanced diffusion of the introduced impurity, and the second temperature-increasing rate is a temperature-increasing rate in such a range that it does not increase the impurity diffusion length.

With the second impurity-activating thermal process method of the present invention, in order to reliably obtain effects as described above, it is preferred that the first holding period is 50 msec or more; and the second holding period is 1 μsec or more.

In one embodiment of the second impurity-activating thermal process method of the present invention, it is preferred that the number of iterations of the second thermal cycle to be performed during the first holding period of the first thermal cycle for holding the temperature at the second predetermined temperature is 5 or less. In other words, the number of iterations of the second thermal cycle can be restricted to 5 or less in view of productivity.

A thermal process apparatus of the present invention is a thermal process apparatus for carrying out the second impurity-activating thermal process method of the present invention as set forth above, including: at least one first lamp for heating the target to the first predetermined temperature or the second predetermined temperature; at least one second lamp for heating the target to the third predetermined temperature; a first charging circuit including a single condenser; a second charging circuit including a plurality of condensers connected in parallel to one another; a first switching mechanism for, after the single condenser is charged, connecting the single charged condenser to the first lamp to thereby discharge the single condenser; and a second switching mechanism for, after the plurality of condensers are charged, successively connecting the plurality of charged condensers to the second lamp to thereby discharge the condensers.

With the thermal process apparatus of the present invention, during the first holding period for holding the temperature at the second predetermined temperature by the first lamp, a plurality of iterations of the temperature-increasing process from the second predetermined temperature to the third predetermined temperature by the second lamp can be performed successively. The first lamp and the second lamp may each be a flash lamp, an arc lamp, or the like. A hot plate may be used instead of a lamp for heating the target to the first predetermined temperature.

In the thermal process apparatus of the present invention, the first lamp and the second lamp may each be provided both above and below the target, or the first lamp may be provided below the target and the second lamp above the target. In the thermal process apparatus of the present invention, the plurality of condensers may be charged at once by the second switching mechanism, or the plurality of condensers may be charged successively by the second switching mechanism.

As described above, according to the present invention, it is possible to improve the impurity activation rate without thermally damaging, for example, the silicon substrate, the pattern formed thereon, the interface therebetween, etc., and without increasing the impurity diffusion length or inactivating the impurity. Therefore, it is possible to reduce the resistance of the source/drain region and that of the extension region in the transistor structure, without increasing the diffusion length or the diffusion depth, whereby it is possible to improve the transistor performance while suppressing the short channel.

Thus, the present invention is directed to an impurity-activating thermal process after the impurity introduction, and is very useful as it provides an advantage that it is possible to further improve the activation rate without increasing the impurity diffusion length.

DETAILED DESCRIPTION OF THE INVENTION

First Embodiment

An impurity-activating thermal process method according to a first embodiment of the present invention will now be described with reference to the drawings.

Figure 1A:
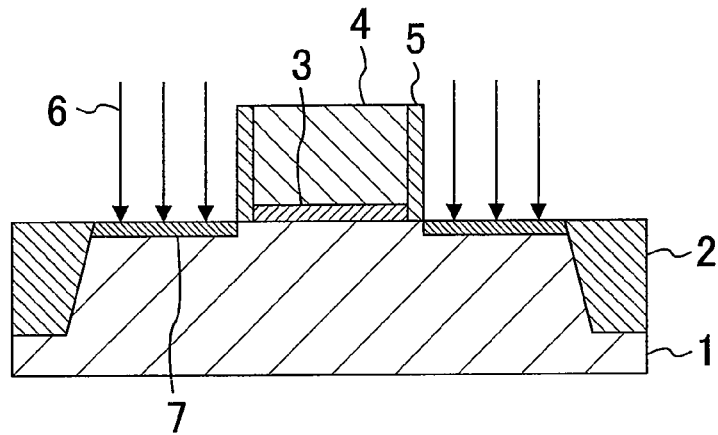
FIGS. 1A to 1C are cross-sectional views each showing a step of a method for manufacturing a semiconductor device using an impurity-activating thermal process method according to first and second embodiments of the present invention.
Figure 1B:
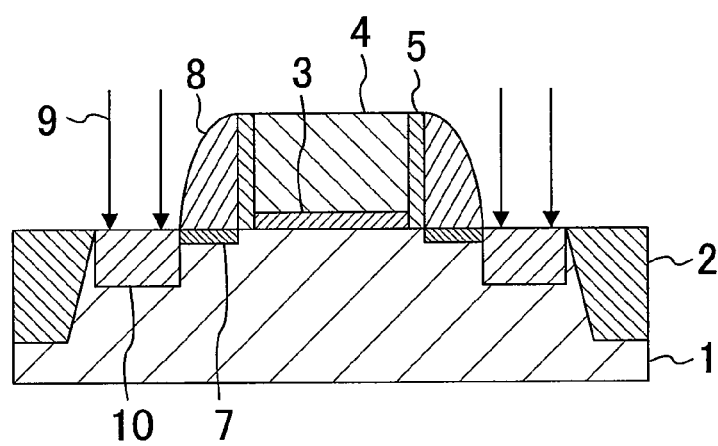
Figure 1C:
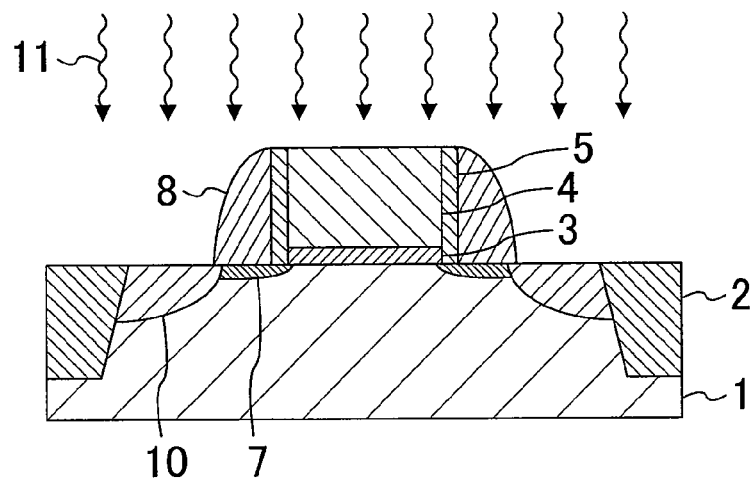

FIGS. 1A to 1C are cross-sectional views each showing a step of a method for manufacturing a semiconductor device based on an impurity-activating thermal process method of the present embodiment, more specifically a method for forming a MOS (metal-oxide-semiconductor) transistor using millisecond annealing for impurity activation.

First, as shown in FIG. 1A, an isolation region 2 is formed on a silicon substrate 1, and an impurity is introduced into the silicon substrate 1 for threshold control, after which a gate electrode 4 is formed on the silicon substrate 1 with a gate insulating film 3 interposed therebetween. Then, after an offset spacer 5 is formed on the sidewall of the gate electrode 4, the silicon substrate 1 is subjected to an impurity ion implantation 6 using the gate electrode 4 and the offset spacer 5 as a mask to thereby form an extension region 7. With the offset spacer 5, the distance from the extension region 7 to an edge of the gate electrode 4 is adjusted. Then, a first iteration of the activation thermal process for activating the impurity in the extension region 7 is performed.

Then, as shown in FIG. 1B, after a sidewall spacer 8 is formed on the sidewall of the gate electrode 4 with the offset spacer 5 interposed therebetween, the silicon substrate I is subjected to an impurity ion implantation 9 using the gate electrode 4, the offset spacer 5 and the sidewall spacer 8 as a mask to thereby form a source/drain region 10.

Figure 2:
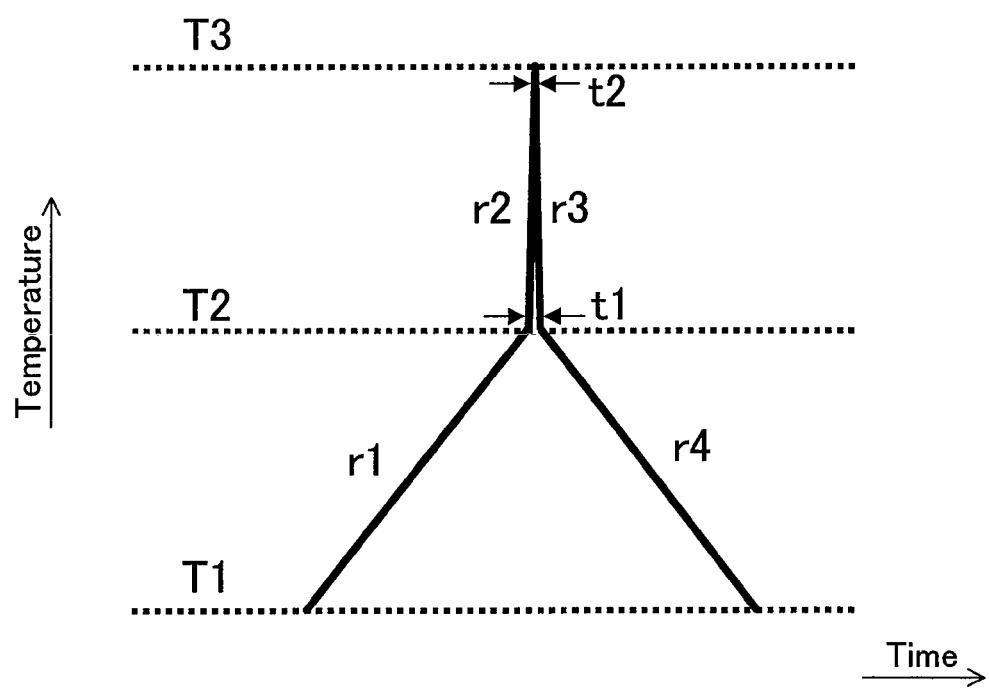
FIG. 2 shows an example of a temperature sequence in the impurity-activating thermal process method according to the first embodiment of the present invention.

Then, as shown in FIG. 1C, the silicon substrate 1 on which a MOS transistor has been formed is subjected to a thermal process 11, i.e., the impurity-activating thermal process method of the present embodiment. The impurity-activating thermal process method of the present embodiment will now be described in detail. FIG. 2 shows an example of a temperature sequence in the impurity-activating thermal process method of the present embodiment.

First, the temperature of the silicon substrate 1 (hereinafter referred to as a "silicon wafer") on which a MOS transistor has been formed is increased from a room temperature (the term "room temperature" as used herein includes temperatures around room temperature) being the initial temperature to a first predetermined temperature T1 (° C.) at an arbitrary temperature-increasing rate. Herein, the first predetermined temperature T1 (° C.) is such that free carriers are generated in a silicon wafer and the free carriers efficiently absorb lamp light or laser light, whereby the temperature of the silicon wafer can easily be increased, and such that there is no increase in the diffusion length of the impurity already introduced into the silicon wafer and there is no inactivation of the introduced impurity. Specifically, the first predetermined temperature T1 (° C.) is selected from a temperature range of 350 to 650° C. In the present embodiment, the first predetermined temperature T1 (° C.) is set to 400° C., for example. The temperature increase to the first predetermined temperature T1 (° C.) also serves to mitigate the thermal stress to be locally imparted due to temperature differences within the silicon wafer when thereafter increasing the temperature from the first predetermined temperature T1 (° C.) to a very high temperature.

Then, the temperature of the silicon wafer is increased from the first predetermined temperature T1 (° C.) of 400° C. to a second predetermined temperature T2 (° C.) of 1000° C. at a temperature-increasing rate less than or equal to the maximum rate r1 (e.g., 200 (° C./sec)) for controlling the activation and the diffusion length of the impurity, which has already been introduced into the silicon wafer. Then, in order to further improve the activation rate without diffusing the already-introduced impurity, the temperature is increased from the second predetermined temperature T2 (° C.) of 1000° C. to a third predetermined temperature T3 (° C.) of 1300° C. at a temperature-increasing rate less than or equal to the maximum rate r2 (e.g., $1.0 \times 10^6$ (° C./sec)), and then the temperature is held at the third predetermined temperature T3 (° C.) of 1300° C. for a holding period (a second holding period t2) of 1 msec, after which the temperature is decreased from the third predetermined temperature T3 (° C.) of 1300° C. to the second predetermined temperature T2 (° C.) of 1000° C. at a temperature-decreasing rate less than or equal to the maximum rate r3 (e.g., $1.0 \times 10^4$ (° C./sec)), which is less than the maximum rate r2.

Then, the temperature is decreased from the second predetermined temperature T2 (° C.) of 1000° C. to the first predetermined temperature T1 (° C.) of 400° C. within 1 sec at maximum from the starting point of the temperature-increasing operation from the second predetermined temperature T2 (° C.) of 1000° C. Thus, the holding period (a first holding period t1) for holding the temperature at the second predetermined temperature T2 (° C.) of 1000° C. is 1 sec or less. The temperature is decreased at a temperature-decreasing rate less than or equal to the maximum rate r4 (e.g., 1000 (° C./sec)) in order to repair the interface state, which has occurred in the silicon wafer due to a process at a very high temperature and a rapid increase/decrease in temperature. Then, the temperature is decreased from the first predetermined temperature T1 (° C.) of 400° C. to the room temperature being the final temperature at an arbitrary temperature-decreasing rate.

According to the present embodiment as described above, during the holding period for holding the temperature at the second predetermined temperature T2, i.e., a predetermined temperature for spike RTA, a thermal process at the third predetermined temperature higher than the second predetermined temperature T2, i.e., millisecond annealing, is performed with the impurity diffusion length being controlled by the second predetermined temperature T2, whereby it is possible to improve the impurity activation rate by millisecond annealing without increasing the impurity diffusion length as controlled by the predetermined temperature for spike RTA. In the impurity-activating thermal process for forming the source/drain region, etc., it is possible to maximize the impurity activation rate while suppressing the increase in the crystal defects and the interface state density, thus improving the transistor capability.

Thus, according to the present embodiment, it is possible to improve the impurity activation rate without thermally damaging, for example, the silicon substrate, the pattern formed thereon, the interface therebetween, etc., and without increasing the impurity diffusion length or inactivating the impurity. Therefore, it is possible to reduce the resistance of the source/drain region and that of the extension region in the transistor structure, without increasing the diffusion length or the diffusion depth, whereby it is possible to improve the transistor performance while suppressing the short channel.

As will be described in detail in the third embodiment to follow, in the present embodiment, a group of flash lamps having a charging circuit including a single condenser is used, for example, for increasing the temperature up to the first predetermined temperature T1 or the second predetermined temperature T2, and a group of flash lamps having a charging circuit including a plurality of condensers connected in parallel to one another is used for increasing the temperature up to the third predetermined temperature T3. While a group of flash lamps is used in each thermal process step in the present embodiment, a single flash lamp may be used instead. Other lamps such as arc lamps may be used instead of flash lamps. A hot plate, instead of a lamp, may be used for increasing the temperature up to the first predetermined temperature T1.

In the present embodiment, during the first holding period t1 for holding the temperature at the second predetermined temperature T2 (° C.) of 1000° C., a temperature-increasing/decreasing process between the second predetermined temperature T2 (° C.) of 1000° C. and the third predetermined temperature T3 (° C.) of 1300° C., i.e., a single iteration of millisecond annealing, is performed. Alternatively, a plurality of iterations of millisecond annealing may be performed during the first holding period t1.

Figure 3A:
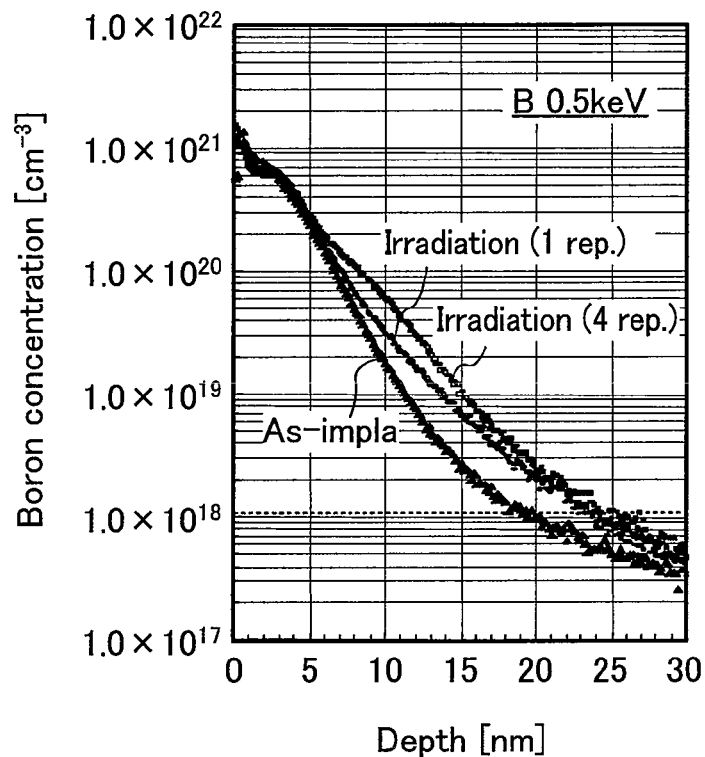
FIG. 3A shows the variation of the impurity diffusion length with respect to the number of iterations of millisecond annealing in the impurity-activating thermal process method according to the first embodiment of the present invention.

FIG. 3A shows the variation of the impurity diffusion length with respect to the number of iterations of millisecond annealing of the present invention. The silicon wafer is subjected to ion implantation at 0.5 keV using boron (B), which has a high diffusion coefficient, as the impurity introduced. FIG. 3A shows an impurity profile where only ion implantation is performed ("As-implant"), an impurity profile where a single iteration of millisecond annealing is performed at a thermal process temperature (i.e., the third predetermined temperature T3) of 1350° C., and an impurity profile where four iterations of millisecond annealing are performed at a thermal process temperature of 1350° C., all measured by SIMS (secondary ion mass spectrometry). As shown in FIG. 3A, in a case where a single iteration of millisecond annealing is performed at a thermal process temperature of 1350° C., as compared with "As-implant", the impurity diffusion length at a B concentration of $1\times10^{18}/cm^3$ is increased by about 5 nm from 18 nm to 23 nm, but the impurity diffusion length is sufficiently suppressed. In a case where four iterations of millisecond annealing are performed at a thermal process temperature of 1350° C., the impurity diffusion length is about the same as that when a single iteration of millisecond annealing is performed at a thermal process temperature of 1350° C., and there is observed no increase in the impurity diffusion length caused by an increase in the number of iterations of millisecond annealing. As to the impurity profile, the process with four iterations of millisecond annealing, as compared with that with a single iteration of millisecond annealing, has a higher boron concentration for the medium diffusion depth, resulting in a more abrupt junction shape.

Figure 3B:
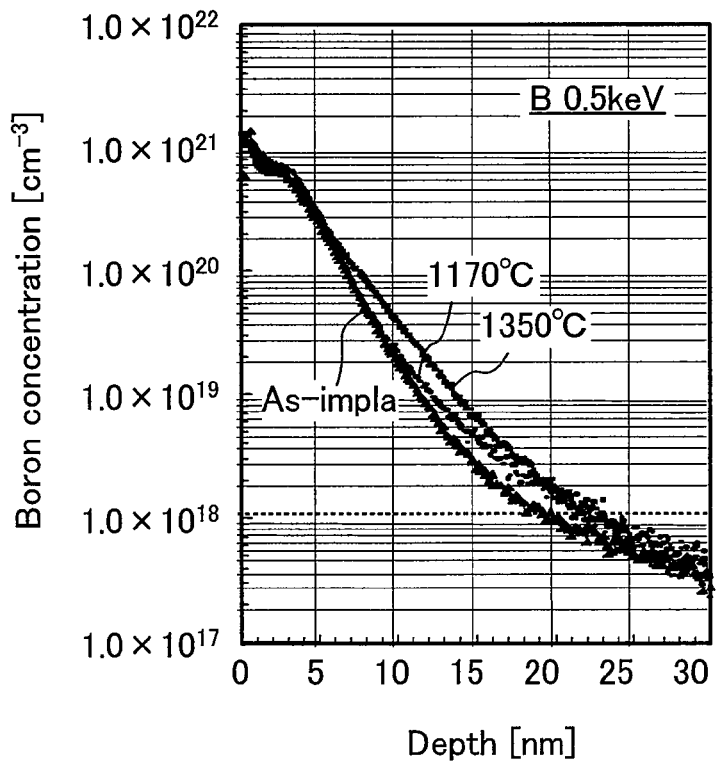
FIG. 3B shows the variation of the impurity diffusion length with respect to the thermal process temperature of millisecond annealing in the impurity-activating thermal process method according to the first embodiment of the present invention.

FIG. 3B shows the variation of the impurity diffusion length (the impurity profile after a millisecond annealing process) with respect to the thermal process temperature (the third predetermined temperature T3) of millisecond annealing of the present invention. As with the case shown in FIG. 3A, the silicon wafer is subjected to ion implantation at 0.5 keV using boron (B), which has a high diffusion coefficient, as the impurity introduced. FIG. 3B shows an impurity profile where only ion implantation is performed ("As-implant"), an impurity profile where the thermal process temperature of millisecond annealing is 1170° C., and an impurity profile where the thermal process temperature of millisecond annealing is 1350° C., all measured by SIMS. As shown in FIG. 3B, both in a case where the thermal process temperature of millisecond annealing is 1170° C. and in a case where it is 1350° C., as compared with "As-implant", the impurity diffusion length at a B concentration of $1\times10^{18}/cm^3$ is increased by about 5 nm, but the impurity diffusion length is sufficiently suppressed. There is observed no increase in the impurity diffusion length caused by an increase in the thermal process temperature of millisecond annealing.

These results shown in FIGS. 3A and 3B indicate that the impurity diffusion length is not increased by a single iteration or a plurality of iterations of millisecond annealing in the present invention, and that the impurity diffusion length is not varied by a change in the thermal process temperature of millisecond annealing.

Figure 4A:
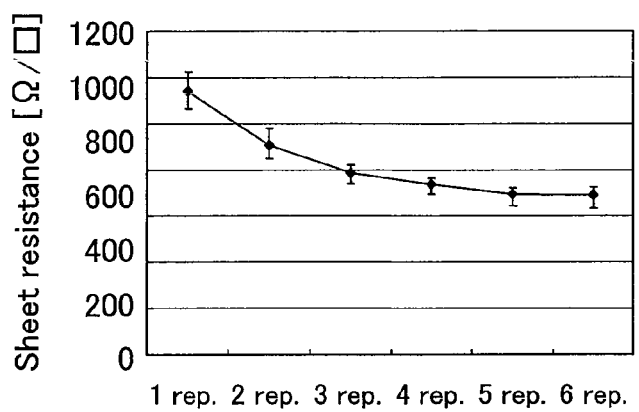
FIG. 4A shows the variation of the sheet resistance with respect to the number of iterations of millisecond annealing in the impurity-activating thermal process method according to the first embodiment of the present invention.

FIG. 4A shows the variation of the sheet resistance with respect to the number of iterations of millisecond annealing of the present invention. As with the case shown in FIG. 3A, the silicon wafer is subjected to ion implantation at 0.5 keV using boron (B), which has a high diffusion coefficient, as the impurity introduced. FIG. 4A shows the sheet resistances for 1 to 6 iterations of millisecond annealing performed at a thermal process temperature (i.e., the third predetermined temperature T3) of 1310° C. As shown in FIG. 4A, while the sheet resistance is 1200Ω/□ when the number of iterations of millisecond annealing is 1, the sheet resistance decreases as the number of iterations of millisecond annealing increases, wherein the sheet resistance is decreased by about 30% to 800Ω/□ when the number of iterations of millisecond annealing is 3, and the sheet resistance is decreased by about 40% to 700Ω/□ when the number of iterations of millisecond annealing is 5. However, the decrease in the sheet resistance is saturated when the number of iterations of millisecond annealing is 6. Therefore, in the present embodiment, the maximum number of iterations of the thermal cycle should be limited to 5. While there will be no significant problems when the number of iterations of millisecond annealing is set to 6 or more, it is not expected to provide a decrease in the sheet resistance, i.e., an improvement in the activation rate, and productivity may possibly be lowered.

Figure 4B:
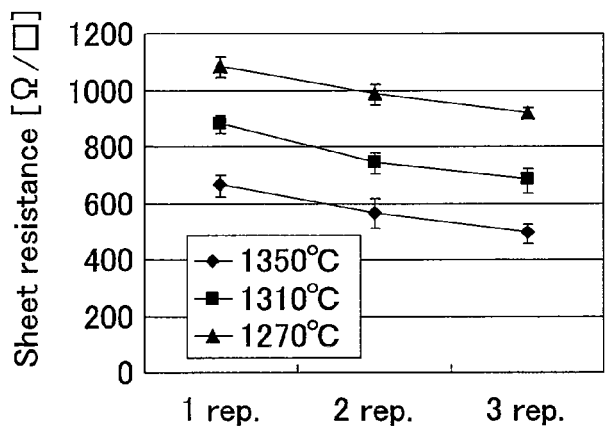
FIG. 4B shows the variation of the sheet resistance with respect to the thermal process temperature of millisecond annealing and the number of iterations thereof in the impurity-activating thermal process method according to the first embodiment of the present invention.

FIG. 4B shows the variation of the sheet resistance in millisecond annealing of the present embodiment with respect to the number of iterations of millisecond annealing being varied from 1 to 3 for each of the thermal process temperatures (i.e., the third predetermined temperature T3) of 1270° C., 1310° C. and 1350° C. As shown in FIG. 4B, the sheet resistance decreases and the activation rate improves as the number of iterations of millisecond annealing increases, but the sheet resistance value is of course significantly influenced also by the thermal process temperature. Specifically, in order to obtain, with a thermal process temperature of 1310° C., substantially the same sheet resistance as that obtained when performing a single iteration of millisecond annealing at a thermal process temperature of 1350° C., it is necessary to set the number of iterations of millisecond annealing at a thermal process temperature of 1310° C. to about 5. In order to obtain, with a thermal process temperature of 1270° C., substantially the same sheet resistance as that obtained when performing a single iteration of millisecond annealing at a thermal process temperature of 1350° C., it is necessary to set the number of iterations of millisecond annealing at a thermal process temperature of 1270° C. to about 8. In view of productivity, however, the number of iterations of millisecond annealing should be limited to about 5, and if the activation rate is insufficient with the number of iterations of millisecond annealing being 5, it is necessary to increase the thermal process temperature so that a sufficient activation rate is obtained by the number of iterations being 5 or so. If the thermal process temperature of millisecond annealing cannot be increased due to material limitations, it is necessary to increase the number of iterations of millisecond annealing even at the risk of sacrificing productivity.

While the second predetermined temperature T2 is set to 1000° C. in the present embodiment, the present invention is not limited thereto, but the temperature may be set to an arbitrary temperature from 650° C. to 1150° C. for the purpose of controlling the impurity diffusion length.

While the third predetermined temperature T3 is set to 1300° C. in the present embodiment, the present invention is not limited thereto, but the temperature may be set to an arbitrary temperature from 1150° C. to 1400° C. (i.e., less than or equal to the melting point of silicon) for the purpose of improving the impurity activation rate without increasing the impurity diffusion length.

While the temperature-increasing rate from the first predetermined temperature T1 (° C.) of 400° C. to the second predetermined temperature T2 (° C.) of 1000° C. is set to be less than or equal to the maximum rate r1 (e.g., 200 (° C./sec)) in the present embodiment, the present invention is not limited thereto, but the temperature-increasing rate may be set to an arbitrary value from 100° C./sec to 1000° C./sec for controlling the activation and the diffusion length of the impurity.

In the present embodiment, the temperature-decreasing rate from the second predetermined temperature T2 (° C.) of 1000° C. to the first predetermined temperature T1 (° C.) of 400° C. may be set to be about equal to or less than the temperature-increasing rate from the first predetermined temperature T1 to the second predetermined temperature T2. Note that the temperature-decreasing rate should not be made unnecessarily high because repairing of the interface state, etc., are done during the operation of decreasing the temperature from the second predetermined temperature T2 to the first predetermined temperature T1.

While the temperature-increasing rate from the second predetermined temperature T2 (° C.) of 1000° C. to the third predetermined temperature T3 (° C.) of 1300° C. is set to be less than or equal to the maximum rate r2 (e.g., $1.0 \times 10^6$ (° C./sec)) in the present embodiment, the present invention is not limited thereto, but the temperature-increasing rate may be set to an arbitrary value from 1000° C./sec to $1.0 \times 10^{7}$° C./sec for the purpose of further improving the activation rate without diffusing the impurity.

In the present embodiment, the temperature-decreasing rate from the third predetermined temperature T3 (° C.) of 1300° C. to the second predetermined temperature T2 (° C.) of 1000° C. may be set to be about equal to or less than the temperature-increasing rate from the second predetermined temperature T2 to the third predetermined temperature T3 (e.g., the temperature-increasing rate divided by a number on the order of 1 or 10).

While the first holding period t1 for holding the temperature at the second predetermined temperature T2 (° C.) of 1000° C. is set to be 1 sec or less in the present embodiment, the first holding period t1 is preferably set to an arbitrary value from 50 msec to 1 sec for the purpose of controlling the activation and the diffusion length of the impurity.

While the second holding period t2 for holding the temperature at the third predetermined temperature T3 (° C.) of 1300° C. is set to 1 msec in the present embodiment, the second holding period t2 is preferably set to an arbitrary value from 1 μsec to 50 msec for the purpose of further improving the activation rate without diffusing the impurity.

Second Embodiment

Figure 5:
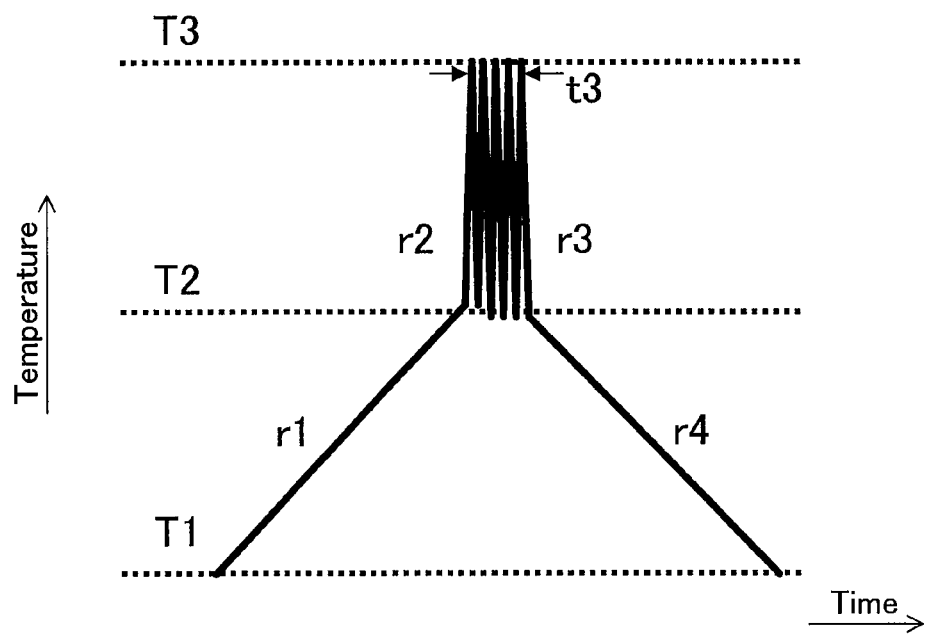
FIG. 5 shows an example of a temperature sequence in the impurity-activating thermal process method according to the second embodiment of the present invention.

An impurity-activating thermal process method according to a second embodiment of the present invention will now be described with reference to the drawings. The method of manufacturing a semiconductor device using the impurity-activating thermal process method of the present embodiment, more specifically steps of a method for forming a MOS transistor using millisecond annealing for impurity activation, are the same as those of the first embodiment shown in FIGS. 1A to 1C. Specifically, an impurity is introduced into the silicon substrate 1 to form the extension region 7 and the source/drain region 10, and then the impurity-activating thermal process method of the present embodiment is performed. The impurity-activating thermal process method of the present embodiment will now be described in detail. FIG. 5 shows an example of a temperature sequence in the impurity-activating thermal process method of the present embodiment.

First, as in the first embodiment, the temperature of the silicon substrate 1 (hereinafter referred to as a "silicon wafer") on which a MOS transistor has been formed is increased from a room temperature being the initial temperature to the first predetermined temperature T1 (° C.) of 400° C. at an arbitrary first temperature-increasing rate. Then, the temperature of the silicon wafer is increased from the first predetermined temperature T1 (° C.) of 400° C. to the second predetermined temperature T2 (° C.) of 1000° C. at a temperature-increasing rate (a temperature-increasing rate similar to that of spike RTA) less than or equal to the maximum rate r1 (e.g., 200 (° C./sec)) for controlling the activation and the diffusion length of the impurity, which has already been introduced into the silicon wafer. Then, in order to further improve the activation rate without diffusing the already-introduced impurity, the temperature is increased from the second predetermined temperature T2 (° C.) of 1000° C. to the third predetermined temperature T3 (° C.) of 1300° C. at a temperature-increasing rate less than or equal to the maximum rate r2 (e.g., $1.0 \times 10^6$ (° C./sec)), and is then held at the third predetermined temperature T3 (° C.) of 1300° C. for a holding period (the second holding period t2) of 50 msec, after which the temperature is decreased from the third predetermined temperature T3 (° C.) of 1300° C. to the second predetermined temperature T2 (° C.) of 1000° C. at a temperature-decreasing rate less than or equal to the maximum rate r3 (e.g., $1.0 \times 10^4$ (° C./sec)).

In the present embodiment, the temperature-increasing/decreasing cycle (millisecond annealing) between the second predetermined temperature T2 (° C.) of 1000° C. and the third predetermined temperature T3 (° C.) of 1300° C. is successively repeated a plurality of times (up to 5 iterations) in a nitrogen atmosphere. While the holding period (the second holding period t2) for holding the temperature at 1300° C. in a single iteration of millisecond annealing is 50 msec, the period t3 required for a plurality of iterations of millisecond annealing (including the interval therebetween) is 1 sec or less. With the successive millisecond annealing of the present embodiment, it is possible to activate the impurity to some extent, and to control the diffusion length to about 30 nm where the impurity is boron.

Then, the temperature is decreased from the second predetermined temperature T2 (° C.) of 1000° C. to the first predetermined temperature T1 (° C.) of 400° C. within 1 sec at maximum from the starting point of the temperature-increasing operation from the second predetermined temperature T2 (° C.) of 1000° C. Thus, the holding period (the first holding period t1) for holding the temperature at the second predetermined temperature T2 (° C.) of 1000° C. is 1 sec or less. The temperature is decreased at a temperature-decreasing rate less than or equal to the maximum rate r4 (e.g., 1000 (° C./sec)) in order to repair the interface state, which has occurred in the silicon wafer due to a process at a very high temperature and a rapid increase/decrease in temperature. Then, the temperature is decreased from the first predetermined temperature T1 (° C.) of 400° C. to the room temperature being the final temperature at an arbitrary temperature-decreasing rate.

According to the present embodiment as described above, during the holding period for holding the temperature at the second predetermined temperature T2, i.e., a predetermined temperature for spike RTA, a thermal process at the third predetermined temperature higher than the second predetermined temperature T2, i.e., millisecond annealing, is performed with the impurity diffusion length being controlled by the second predetermined temperature T2, whereby it is possible to improve the impurity activation rate by millisecond annealing without increasing the impurity diffusion length as controlled by the predetermined temperature for spike RTA. In the impurity-activating thermal process for forming the source/drain region, etc., it is possible to maximize the impurity activation rate while suppressing the increase in the crystal defects and the interface state density, thus improving the transistor capability.

Thus, according to the present embodiment, it is possible to improve the impurity activation rate without thermally damaging, for example, the silicon substrate, the pattern formed thereon, the interface therebetween, etc., and without increasing the impurity diffusion length or inactivating the impurity. Therefore, it is possible to reduce the resistance of the source/drain region and that of the extension region in the transistor structure, without increasing the diffusion length or the diffusion depth, whereby it is possible to improve the transistor performance while suppressing the short channel.

The thermal process apparatus used in the present embodiment is the same as that used in the first embodiment.

Figure 6:
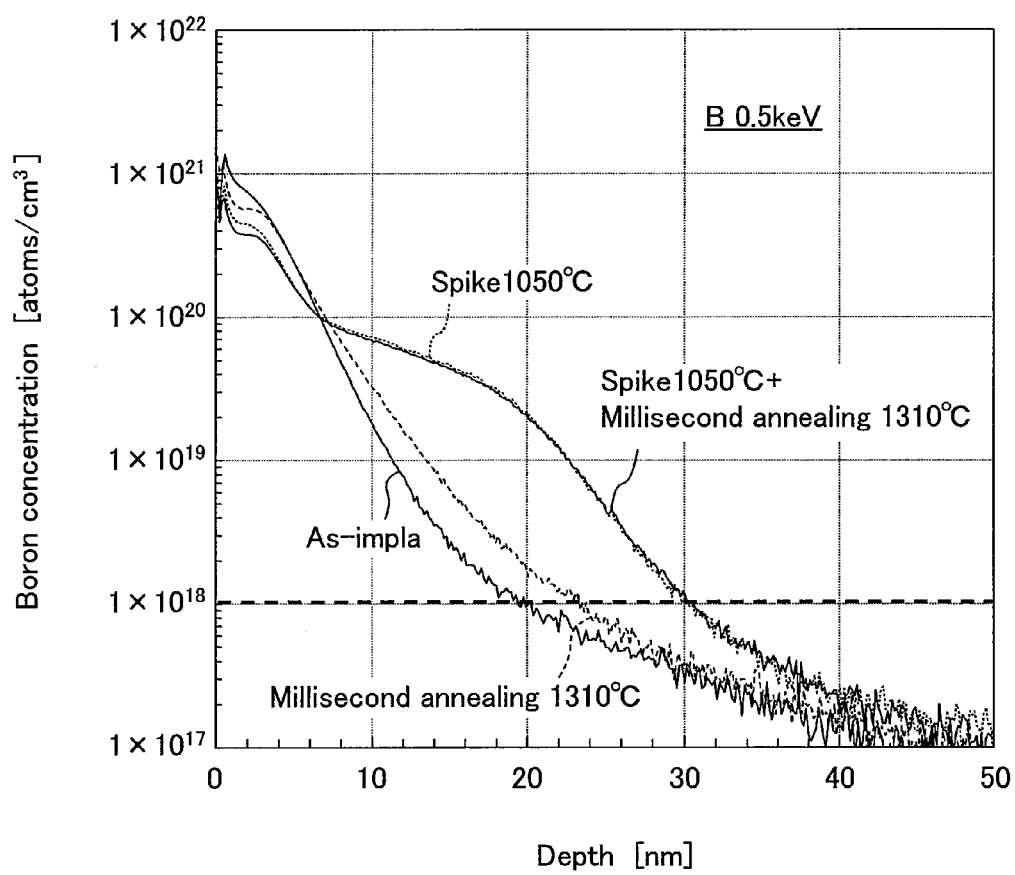
FIG. 6 shows an impurity profile measured when only ion implantation is performed, an impurity profile measured when only spike RTA is performed after the ion implantation, an impurity profile measured when only a single iteration of millisecond annealing is performed after the ion implantation, and an impurity profile measured when spike RTA and a single iteration of millisecond annealing are performed after the ion implantation.

FIG. 6 shows an impurity profile where only ion implantation is performed ("As-implant"), an impurity profile where only spike RTA at a thermal process temperature of 1050° C. is performed as the impurity-activating thermal process after the ion implantation, an impurity profile where only a single iteration of millisecond annealing at a thermal process temperature of 1310° C. is performed as the impurity-activating thermal process after the ion implantation, and an impurity profile where spike RTA at a thermal process temperature of 1050° C. and a single iteration of millisecond annealing at a thermal process temperature of 1310° C. are performed as the impurity-activating thermal process after the ion implantation, all measured by SIMS. The silicon wafer is subjected to ion implantation at 0.5 keV using boron (B), which has a high diffusion coefficient, as the impurity introduced.

As shown in FIG. 6, while the impurity diffusion depth at a B concentration of $1\times10^{18}/cm^3$ for "As-implant" is 20 nm, the impurity diffusion depth at a B concentration of $1\times10^{18}/cm^3$ where only spike RTA (1050° C.) is performed is 30 nm, the impurity diffusion depth at a B concentration of $1\times10^{18}/cm^3$ where only a single iteration of millisecond annealing (1310° C.) is performed is 23 nm, and the impurity diffusion depth at a B concentration of $1\times10^{18}/cm^3$ where spike RTA (1050° C.) and a single iteration of millisecond annealing (1310° C.) are performed is 30 nm. Thus, the impurity profile depends substantially solely on spike RTA, and millisecond annealing makes little difference. Thus, it is possible to control the impurity diffusion length by performing spike RTA or RTA in addition to millisecond annealing. Since the activation rate by spike RTA is not sufficient even if the thermal process temperature is 1050° C., the temperature and the time of spike RTA or RTA may be determined simply for the purpose of controlling the impurity diffusion length, and the impurity activation may be done by performing millisecond annealing during spike RTA or RTA.

In the present embodiment, the diffusion length of the introduced impurity is controlled by the temperature-increasing/decreasing process between the first predetermined temperature T1 and the second predetermined temperature T2 (spike RTA: T1→T2→T1), and the impurity activation is controlled by the temperature-increasing/decreasing process from the second predetermined temperature T2 to the third predetermined temperature T3 (millisecond annealing: T2→T3→T2→T3→T2→ ... →T2)).

Figure 7:
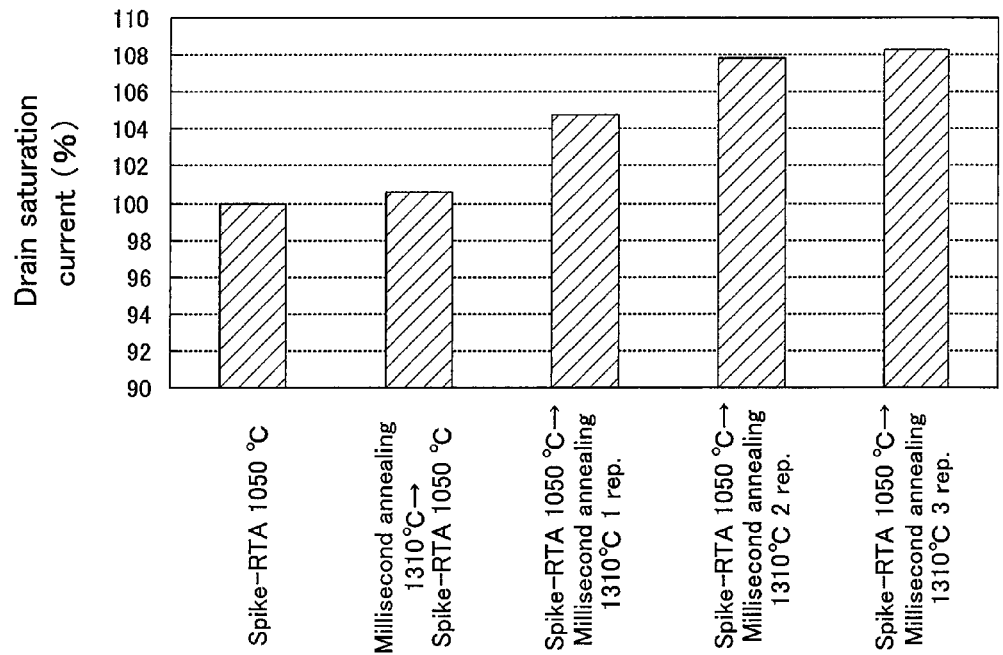
FIG. 7 illustrates the effect of the impurity-activating thermal process method according to the second embodiment of the present invention, showing a comparison in terms of the N-channel transistor drain current (saturation current) between various impurity-activating thermal processes performed for forming the extension region and the source/drain region.

FIG. 7 illustrates the effect of the present embodiment, showing a comparison in terms of the N-channel transistor drain current (saturation current) between various impurity-activating thermal processes performed for forming the extension region and the source/drain region. The drain current was evaluated for a case where only spike RTA at a thermal process temperature of 1050° C. was performed, a case where spike RTA at a thermal process temperature of 1050° C. was performed after a single iteration of millisecond annealing at a thermal process temperature of 1310° C. was performed, a case where a single iteration of millisecond annealing at a thermal process temperature of 1310° C. was performed after spike RTA at a thermal process temperature of 1050° C. was performed, a case where two iterations of millisecond annealing at a thermal process temperature of 1310° C. were performed after spike RTA at a thermal process temperature of 1050° C. was performed, and a case where three iterations of millisecond annealing at thermal process temperature of 1310° C. were performed after spike RTA at a thermal process temperature of 1050° C. was performed.

As shown in FIG. 7, with the drain current of the N-channel transistor where only spike RTA at a thermal process temperature of 1050° C. is performed being 100%, the drain current is increased only by about 0.5% in a case where spike RTA at a thermal process temperature of 1050° C. is performed after a single iteration of millisecond annealing at a thermal process temperature of 1310° C. is performed. In contrast, where millisecond annealing at a thermal process temperature of 1310° C. is performed after spike RTA at a thermal process temperature of 1050° C. is performed, the drain current of the N-channel transistor is increased by about 4.6% by a single iteration of millisecond annealing, by about 7.8% by two iterations of millisecond annealing, and by about 8.5% by three iterations of millisecond annealing. Thus, although the drive power of the transistor is not substantially improved by performing spike RTA after performing millisecond annealing, the drive power of the transistor can be improved by performing millisecond annealing after performing spike RTA (particularly, if millisecond annealing is performed repeatedly). The reason may be as follows. Where millisecond annealing is performed first, the impurity is activated by the millisecond annealing but defects in the substrate cannot sufficiently be repaired, whereby the impurity is inactivated when spike RTA is performed thereafter. In contrast, where millisecond annealing is performed after spike RTA is performed, it is possible to prevent such an inactivation of the impurity and to improve the transistor capability.

Figure 8:
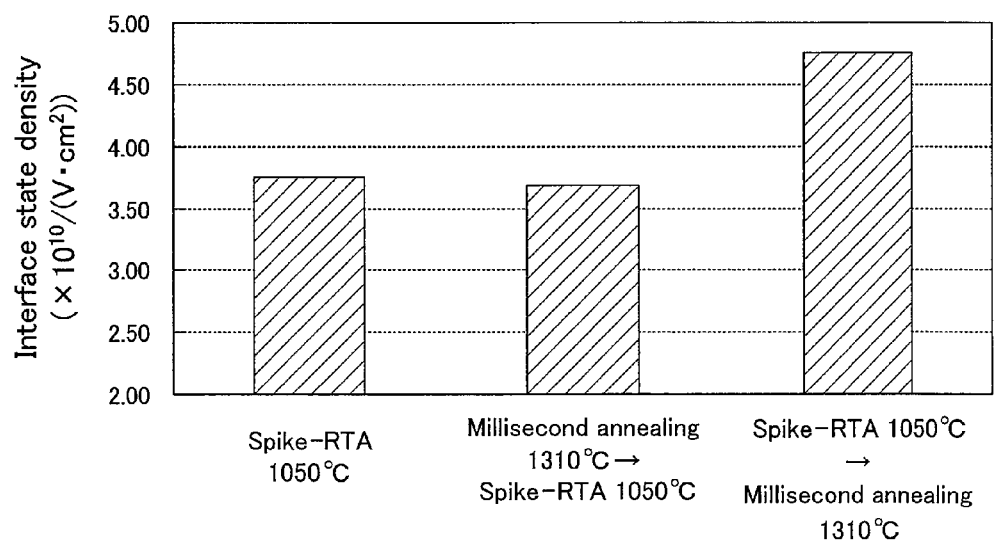
FIG. 8 illustrates the effect of the impurity-activating thermal process method according to the second embodiment of the present invention, showing a comparison in terms of the interface state density between various impurity-activating thermal processes performed for forming the extension region and the source/drain region.

FIG. 8 illustrates the effect of the present embodiment, showing a comparison in terms of the interface state density (the interface state density at the interface between the silicon substrate and the gate insulating film) between various impurity-activating thermal processes performed for forming the extension region and the source/drain region. The interface state density was evaluated for a case where only spike RTA at a thermal process temperature of 1050° C. was performed, a case where spike RTA at a thermal process temperature of 1050° C. was performed after a single iteration of millisecond annealing at a thermal process temperature of 1310° C. was performed, and a case where a single iteration of millisecond annealing at a thermal process temperature of 1310° C. was performed after spike RTA at a thermal process temperature of 1050° C. was performed.

As shown in FIG. 8, the interface state density of the N-channel transistor in a case where only spike RTA at a thermal process temperature of 1050° C. is performed and that in a case where spike RTA at a thermal process temperature of 1050° C. is performed after millisecond annealing at a thermal process temperature of 1310° C. is performed are substantially equal to each other, and there is observed no deterioration in the interface characteristic in either case. In contrast, in a case where millisecond annealing at a thermal process temperature of 1310° C. is performed after spike RTA at a thermal process temperature of 1050° C. is performed, the interface state density is increased by about 25%, thus significantly deteriorating the interface characteristic, as compared with a case where only spike RTA at a thermal process temperature of 1050° C. is performed and a case where spike RTA at a thermal process temperature of 1050° C. is performed after millisecond annealing at a thermal process temperature of 1310° C. is performed. The reason may be as follows. In a case where millisecond annealing is performed later, bonding in the substrate near the interface is broken off due to a process at a very high temperature, and crystals of the substrate that have been damaged by the high-temperature process cannot sufficiently be repaired because the temperature-decreasing rate is very high. In contrast, where spike RTA is performed later, crystals of the substrate can be reconstructed.

As described above, where spike RTA and millisecond annealing are combined together, there are technical problems when millisecond annealing is performed after spike RTA or when spike RTA is performed after millisecond annealing, as is in the prior art. On the other hand, if spike RTA and millisecond annealing are performed at the same time as are in the present invention, it is possible to solve the problems occurring where spike RTA and millisecond annealing are performed separately and to further improve the impurity activation rate.

While the first predetermined temperature T1 is set to 400° C. in the present embodiment, the present invention is not limited thereto, but the temperature may be set to an arbitrary temperature from 350° C. to 650° C. for the purpose of facilitating the increase in the temperature of the silicon wafer through generation of free carriers in the silicon wafer.

While the second predetermined temperature T2 is set to 1000° C. in the present embodiment, the present invention is not limited thereto, but the temperature may be set to an arbitrary temperature from 650° C. to 1150° C. for the purpose of controlling the impurity diffusion length.

While the third predetermined temperature T3 is set to 1300° C. in the present embodiment, the present invention is not limited thereto, but the temperature may be set to an arbitrary temperature from 1150° C. to 1400° C. (i.e., less than or equal to the melting point of silicon) for the purpose of improving the impurity activation rate without increasing the impurity diffusion length.

While the temperature-increasing rate from the first predetermined temperature T1 (° C.) of 400° C. to the second predetermined temperature T2 (° C.) of 1000° C. is set to be less than or equal to the maximum rate r1 (e.g., 200 (° C./sec)) in the present embodiment, the present invention is not limited thereto, but the temperature-increasing rate may be set to an arbitrary value from 100° C./sec to 1000° C./sec for the purpose of controlling the activation and the diffusion length of the impurity.

In the present embodiment, the temperature-decreasing rate from the second predetermined temperature T2 (° C.) of 1000° C. to the first predetermined temperature T1 (° C.) of 400° C. may be set to be about equal to or less than the temperature-increasing rate from the first predetermined temperature T1 to the second predetermined temperature T2. Note that the temperature-decreasing rate should not be made unnecessarily high because repairing of the interface state, etc., are done during the operation of decreasing the temperature from the second predetermined temperature T2 to the first predetermined temperature T1.

While the temperature-increasing rate from the second predetermined temperature T2 (° C.) of 1000° C. to the third predetermined temperature T3 (° C.) of 1300° C. is set to be less than or equal to the maximum rate r2 (e.g., $1.0 \times 10^6$ (° C./sec)) in the present embodiment, the present invention is not limited thereto, but the temperature-increasing rate may be set to an arbitrary value from 1000° C./sec to $1.0 \times 10^7$ ° C./sec for the purpose of further improving the activation rate without diffusing the impurity.

In the present embodiment, the temperature-decreasing rate from the third predetermined temperature T3 (° C.) of 1300° C. to the second predetermined temperature T2 (° C.) of 1000° C. may be set to be about equal to or less than the temperature-increasing rate from the second predetermined temperature T2 to the third predetermined temperature T3 (e.g., the temperature-increasing rate divided by a number on the order of 1 or 10).

While the first holding period t1 for holding the temperature at the second predetermined temperature T2 (° C.) of 1000° C. is set to be 1 sec or less in the present embodiment, the first holding period t1 is preferably set to an arbitrary value from 50 msec to 1 sec for the purpose of controlling the activation and the diffusion length of the impurity.

While the second holding period t2 for holding the temperature at the third predetermined temperature T3 (° C.) of 1300° C. is set to 1 msec in the present embodiment, the second holding period t2 is preferably set to an arbitrary value from 1 μsec to 50 msec for the purpose of further improving the activation rate without diffusing the impurity.

The number of iterations of millisecond annealing in the present embodiment should be as many as possible in view of the improvement in the impurity activation rate, but the number of iterations should be limited to 5 or so in view of productivity.

Third Embodiment

A thermal process apparatus according to a third embodiment of the present invention, more specifically a thermal process apparatus for carrying out the impurity-activating thermal process method of the first and second embodiments, will now be described with reference to the drawings with respect to a case where a flash lamp (e.g., an Xe flash lamp) is used as the heat source.

Figure 9A:
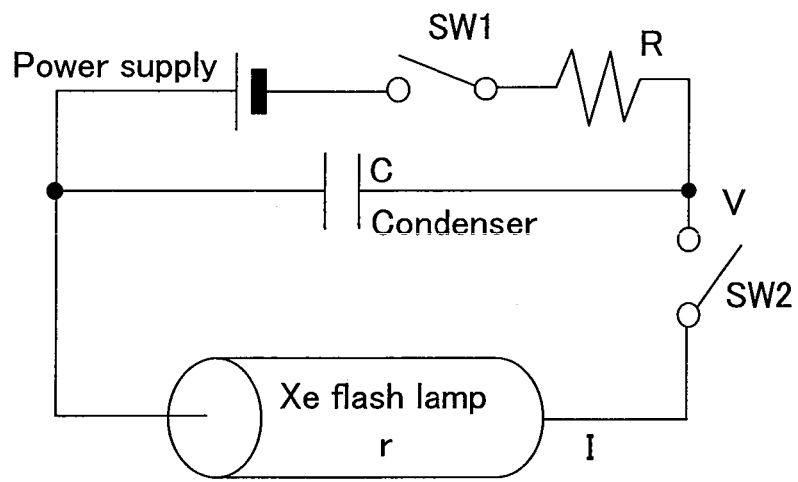
FIG. 9A is a circuit diagram showing a general configuration of a millisecond annealing apparatus of a comparative example.
Figure 9B:
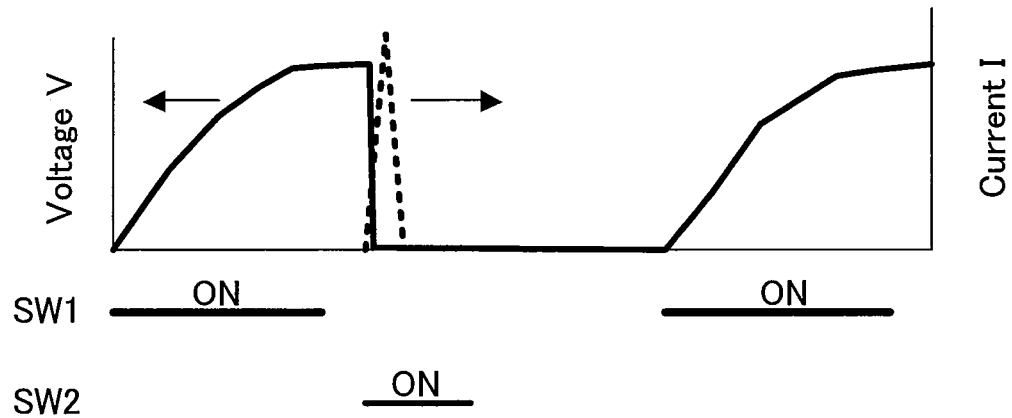
FIG. 9B illustrates an operation thereof.

First, a millisecond annealing apparatus using an ordinary flash lamp (a millisecond annealing apparatus of a comparative example) will be described with reference to FIGS. 9A and 9B. FIG. 9A is a circuit diagram showing a general configuration of a millisecond annealing apparatus of a comparative example, and FIG. 9B illustrates an operation thereof. As shown in FIG. 9A, the millisecond annealing apparatus of the comparative example includes a condenser (the capacitance C) and a Xe flash lamp (the internal resistance r) connected in parallel to each other and to the power supply. A switch SW1 and a serial resistor R are provided in series between the power supply and the condenser, and the switch SW1, the serial resistor R and a switch SW2 are provided in series between the power supply and the Xe flash lamp (the internal resistance r). As shown in FIG. 9B, when flashing the flash lamp, the switch SW1 connected to the power supply is first turned ON to once charge the condenser (the capacitance C). Then, the switch SW1 is turned OFF, and the switch SW2 connected to the flash lamp is turned ON to thereby send at once the charge stored in the condenser to the flash lamp. Specifically, the power supply is connected to the condenser during the charging operation, and the condenser is connected to the flash lamp while flashing the flash lamp. Therefore, the holding period for holding the temperature at the peak temperature of the thermal process is determined by the capacitance C of the condenser and the internal resistance r of the flash lamp. Specifically, the transition of the voltage V over time when the condenser is discharged is expressed as follows:

$$V(t)=E \cdot \exp(-t/(C \cdot r))$$

where t denotes time, and E denotes the maximum voltage. The transition of the voltage V over time is dependent on the capacitance C of the condenser and the internal resistance r of the flash lamp. A variable resistor vr may be provided in series with the flash lamp in order to control the amount of time for which the flash lamp flashes. In other words, by varying the resistance value of the variable resistor vr, it is possible to vary the holding period for holding the temperature at the peak temperature of the thermal process.

A characteristic of the thermal process apparatus of the present embodiment is that the thermal process apparatus includes two different flash lamps, i.e., a first group of flash lamps for spike RTA and a second group of flash lamps for millisecond annealing.

Figure 10A:
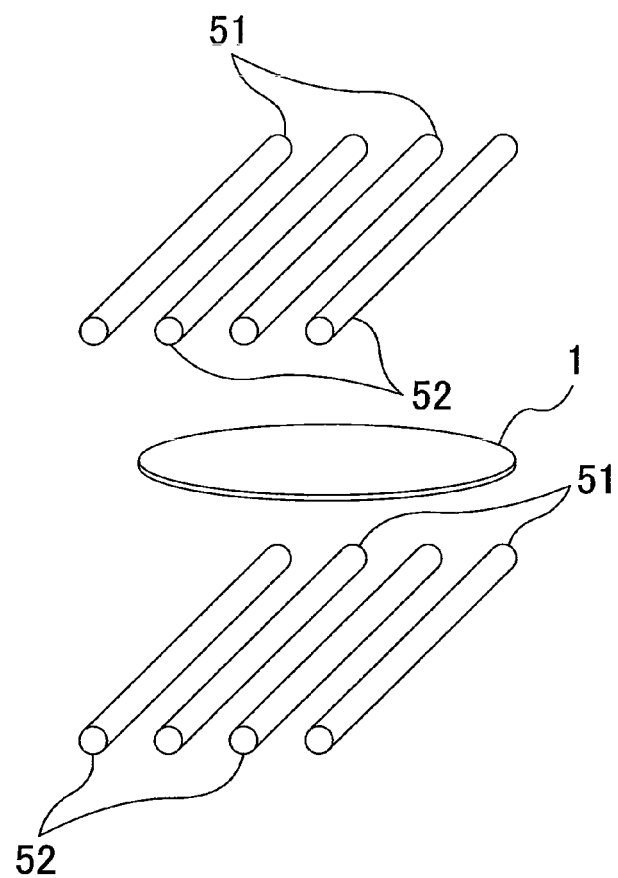
FIGS. 10A and 10B each show a general configuration of a thermal process apparatus according to a third embodiment of the present invention.
Figure 10B:
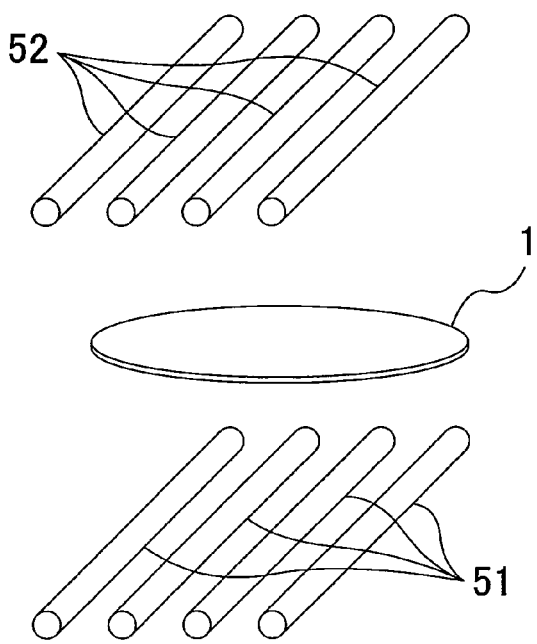

FIGS. 10A and 10B each show a general configuration of a thermal process apparatus of the present embodiment. Specifically, first flash lamps 51 for spike RTA and second flash lamps 52 for millisecond annealing may be provided in a predetermined arrangement above and below the silicon substrate (silicon wafer) 1, as shown in FIG. 10A. Alternatively, although not shown in the figure, the first flash lamps 51 for spike RTA and the second flash lamps 52 for millisecond annealing may be provided in a predetermined arrangement only above the silicon wafer 1. Alternatively, the first flash lamps 51 for spike RTA may be provided below the silicon wafer 1 and the second flash lamps 52 for millisecond annealing may be provided above the silicon wafer 1, as shown in FIG. 10B. The arrangement where the first flash lamps 51 for spike RTA are provided above the silicon wafer 1 and the second flash lamps 52 for millisecond annealing are provided below the silicon wafer 1 cannot be employed because the second flash lamps 52 for millisecond annealing are capable of heating only a very shallow range of the light irradiation region, and because the device region that should be heated by the second flash lamps 52 for millisecond annealing is present on a surface portion of the silicon wafer 1.

With any of these apparatus configurations, the flash lamps 51 and 52 and the silicon wafer 1 are supported by a holding member (not shown) in a chamber (not shown). With any of these apparatus configurations, a group of low-power flash lamps for increasing the temperature to the first predetermined temperature T1 may be provided at least either above or below the silicon wafer 1.

Figure 11A:
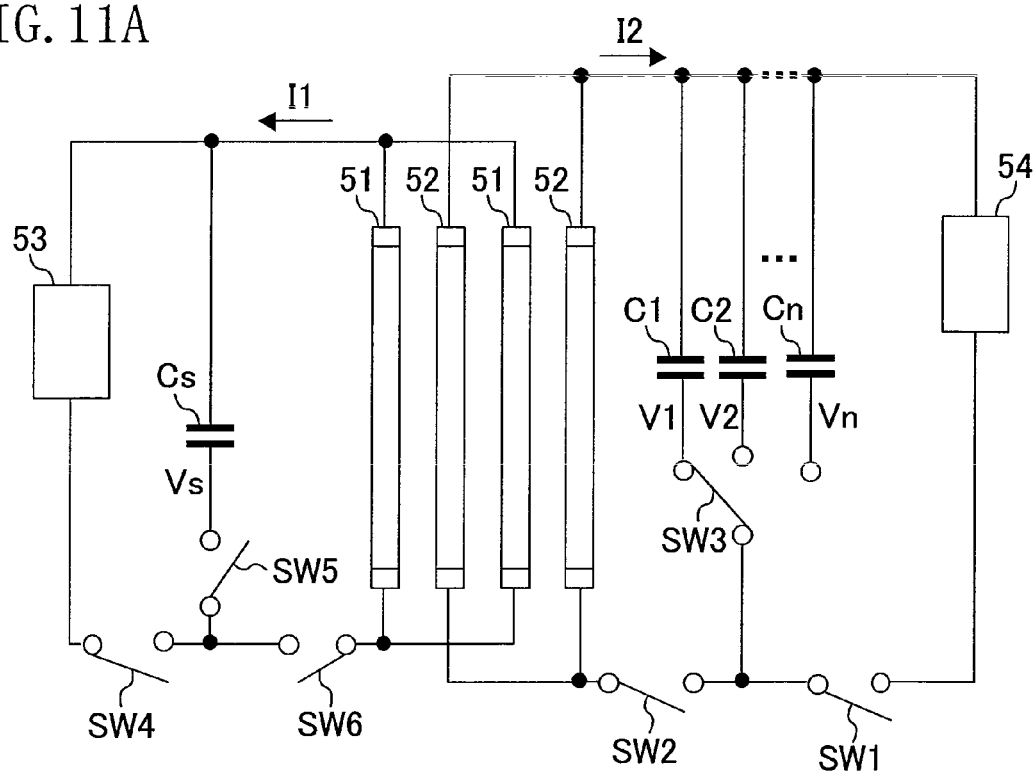
FIG. 11A is a circuit diagram showing a general configuration of a thermal process apparatus according to the third embodiment of the present invention.
Figure 11B:
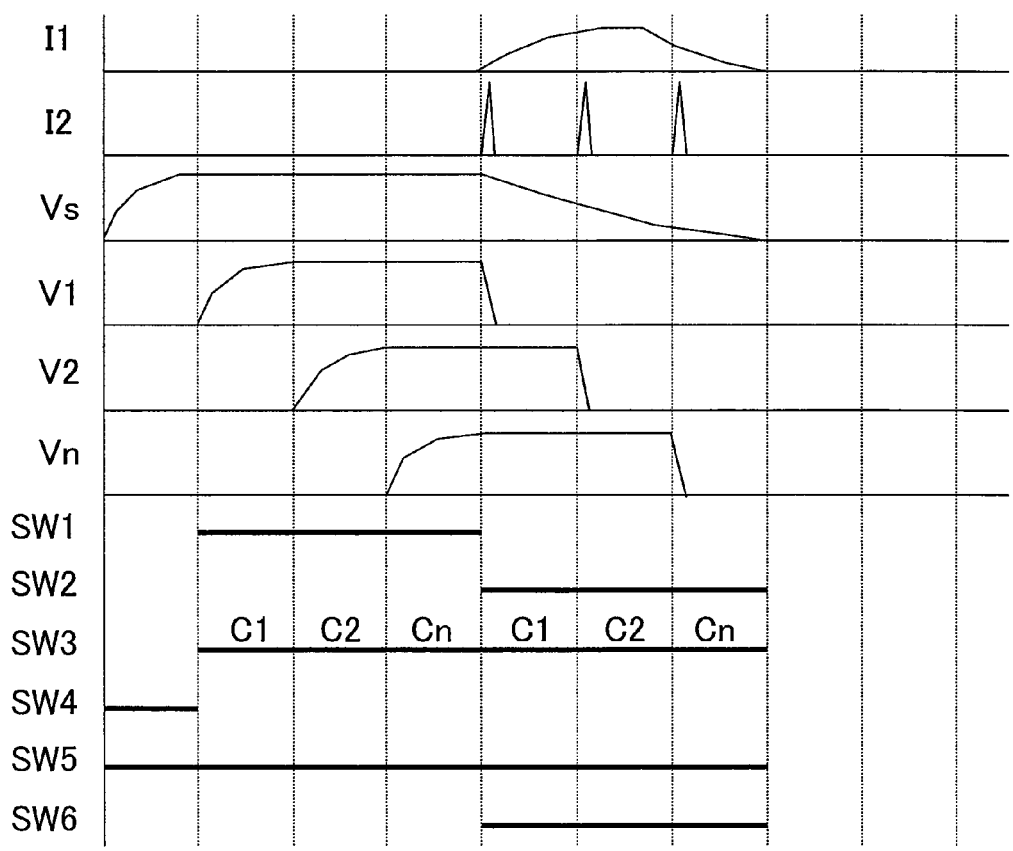
FIG. 11B illustrates an operation thereof.

FIG. 11A is a circuit diagram showing a general configuration of the thermal process apparatus of the present embodiment, and FIG. 11B illustrates an operation thereof. As shown in FIG. 11A, the thermal process apparatus of the present embodiment includes a circuit to which the first flash lamps 51 for spike RTA (hereinafter referred to also as a "first group of flash lamps 51") are connected, and a separate circuit to which the second flash lamps 52 for millisecond annealing (hereinafter referred to also as a "second group of flash lamps 52") are connected.

Specifically, as shown in FIG. 11A, in a circuit to which the first group of flash lamps 51 are connected, a condenser Cs and the first group of flash lamps 51 are connected in parallel to each other and to a power supply 53. A switch SW4 and a switch SW5 are provided in series between the Dower supply 53 and the condenser Cs, and the switch SW4 and a switch SW6 are provided in series between the power supply 53 and the first group of flash lamps 51. Herein, I1 denotes the current flowing from the condenser Cs to the first group of flash lamps 51, and Vs denotes the voltage across the condenser Cs. Where a group of low-power flash lamps are provided in the thermal process apparatus of the present embodiment for increasing the temperature to the first predetermined temperature T1, the group of low-power flash lamps have a similar circuit configuration to that of the first group of flash lamps 51 described above.

As shown in FIG. 11A, in a circuit to which the second group of flash lamps 52 are connected, a plurality (N) of condensers C1, C2, . . . , Cn and the second group of flash lamps 52 are connected in parallel to each other and to a power supply 54. The switch SW1 and the switch SW3 are provided in series between the power supply 54 and condensers C1, C2, . . . , Cn, and the switch SW1 and the switch SW2 are provided in series between the power supply 54 and the second group of flash lamps 52. Herein, I2 denotes the current flowing from the condensers C1, C2, . . . , Cn to the second group of flash lamps 52, and V1, V2, . . . , Vn denote voltages across the condensers C1, C2, . . . , Cn, respectively.

As shown in FIG. 11B, when flashing the groups of flash lamps 51 and 52, the switch SW1 is turned ON, and the switch SW3 is switched from one position to another, thereby successively charging the plurality of condensers C1, C2, . . . , Cn from the power supply 54, while the switch SW4 and the switch SW5 are turned ON to thereby charge the condenser Cs from the power supply 53. Then, the switch SW4 is turned OFF and the switch SW6 is turned ON, thereby sending the charge from the condenser Cs to the first group of flash lamps 51, thus starting the light emission from the first group of flash lamps 51, i.e., spike RTA. Then, after the switch SW1 is turned OFF, the switch SW2 connected to the second group of flash lamps 52 is turned ON and the switch SW3 is switched from one position to another, thereby sending the charge successively from the condensers C1, C2 . . . , Cn to the second group of flash lamps 52. Thus, it is possible to successively perform a number of iterations (equal to the number N of condensers) of millisecond annealing. This successive millisecond annealing operation is performed during a spike RTA process as described above.

An impurity-activating thermal process method using a thermal process apparatus of the present embodiment, more specifically an example of a method for forming a MOS transistor using millisecond annealing for impurity activation, will now be described. Steps of the method for forming a MOS transistor are the same as those of the first embodiment shown in FIGS. 1A to 1C. In the present embodiment, after the steps shown in FIGS. 1A and 1B, an impurity-activating thermal process is performed using the above thermal process apparatus (a thermal process apparatus having a flash lamp) of the present embodiment in the step shown in FIG. 1C.

Before performing spike RTA and millisecond annealing using the thermal process apparatus of the present embodiment, a hot plate is used to increase the temperature of the silicon wafer to be heated from the room temperature (the term "room temperature" as used herein includes temperatures around room temperature) T0 being the initial temperature to the first predetermined temperature T1 of 400° C. and then hold the temperature at 400° C. A low-power flash lamp having a similar circuit configuration to that of the first flash lamps 51 for spike RTA shown in FIG. 11A may be used instead of a hot plate.

Then, using the first flash lamps 51 for spike RTA in the thermal process apparatus of the present embodiment, the temperature of the silicon wafer is increased from the first predetermined temperature T1 (° C.) of 400° C. to the second predetermined temperature T2 (° C.) of 1000° C. Then, using the second flash lamps 52 for millisecond annealing, the temperature of the silicon wafer is increased from the second predetermined temperature T2 (° C.) of 1000° C. to the third predetermined temperature T3 (° C.) of 1300° C. at a temperature-increasing rate of up to $1.0 \times 10^6$ (° C./sec), and then the temperature is held at the third predetermined temperature T3 (° C.) of 1300° C. for 50 msec, after which the temperature is decreased from the third predetermined temperature T3 (° C.) of 1300° C. to the second predetermined temperature T2 (° C.) of 1000° C. With the thermal process apparatus of the present embodiment, the temperature-increasing/decreasing cycle (millisecond annealing) between the second predetermined temperature T2 (° C.) of 1000° C. and the third predetermined temperature T3 (° C.) of 1300° C. is successively repeated a plurality of times (up to 5 iterations). Then, the temperature is decreased from the second predetermined temperature T2 (° C.) of 1000° C. to the first predetermined temperature T1 (° C.) of 400° C., and is then decreased from the first predetermined temperature T1 (° C.) of 400° C. to the room temperature being the final temperature.

The millisecond annealing apparatus of the comparative example shown in FIG. 9A may include a plurality of flash lamps but it includes only one condenser, and it is not possible to successively perform a plurality of flash lamp irradiations, whereby the silicon wafer needs to be taken out of the thermal process apparatus after every flash lamp irradiation before it is subjected to the following flash lamp irradiation. In contrast, with the thermal process apparatus of the present embodiment shown in FIG. 11A, it is possible to successively discharge the flash lamp by switching the plurality of condensers from one to another, and it is possible to successively perform a plurality of iterations of millisecond annealing.

Typically, in the case of a flash lamp, the thermal process temperature holding period is determined by the capacitance (C) of the condenser and the internal resistance (serial resistance) r of the flash lamp. Therefore, varying the thermal process temperature holding period by varying the serial resistance r is not easy, as compared with laser irradiation. Also when shortening the thermal process temperature holding period in order to prevent crystal defects, it is not easy to change the holding period. In contrast, successively performing a plurality of iterations of flash lamp irradiation with lowering of the thermal process temperature, as in the present embodiment, is advantageous in that productivity can be made very high while maintaining or improving the activation rate.

As described above, according to the third embodiment, it is possible to successively perform a plurality of iterations of millisecond annealing by the second flash lamps 52 during the holding period for holding the temperature at a predetermined temperature for spike RTA performed by the first flash lamps 51, and it is therefore possible to obtain similar effects to those of the first and second embodiments. A device can be subjected to a plurality of iterations of millisecond annealing without sacrificing productivity using a so-called "flash annealing" where a flash lamp is used as the heat source, whereby it is possible to improve the impurity activation rate and to realize a high-performance transistor.

While millisecond annealing is performed using a flash lamp in the third embodiment, it is possible to obtain similar effects to those of the present embodiment by employing a similar configuration to that of the present embodiment also in a case where millisecond annealing is performed using an arc lamp.

Variation of Third Embodiment

A thermal process apparatus according to a variation of the third embodiment of the present invention, more specifically a thermal process apparatus for carrying out the impurity-activating thermal process method of the first and second embodiments, will now be described with reference to the drawings with respect to a case where a flash lamp (e.g., an Xe flash lamp) is used as the heat source.

Figure 12A:
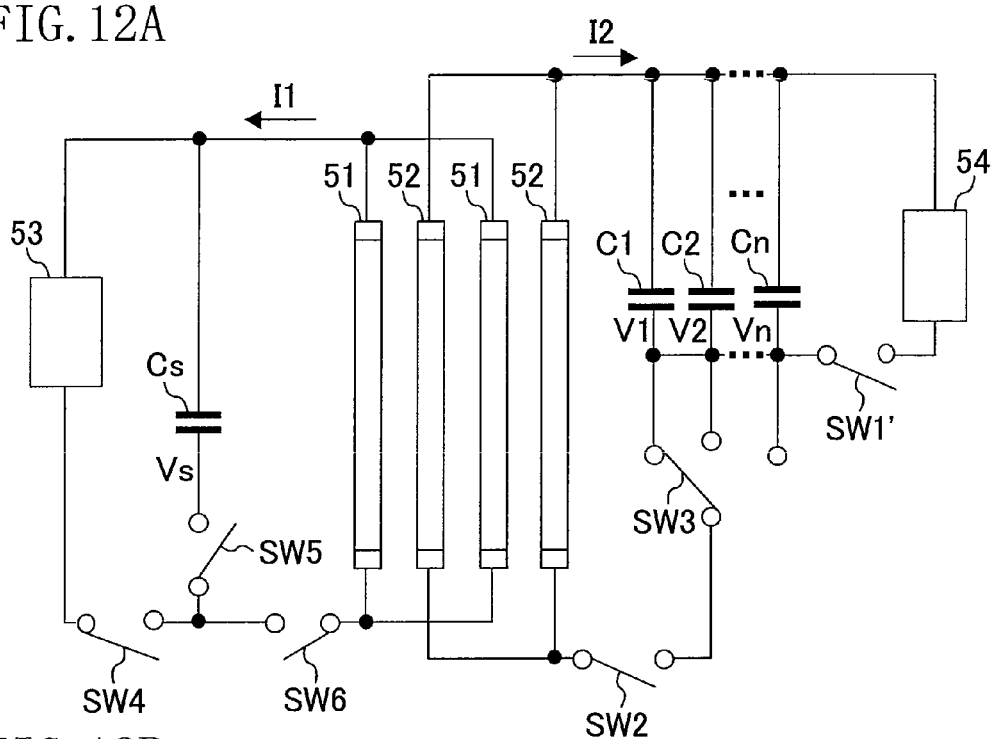
FIG. 12A is a circuit diagram showing a general configuration of a thermal process apparatus according to a variation of the third embodiment of the present invention.
Figure 12B:
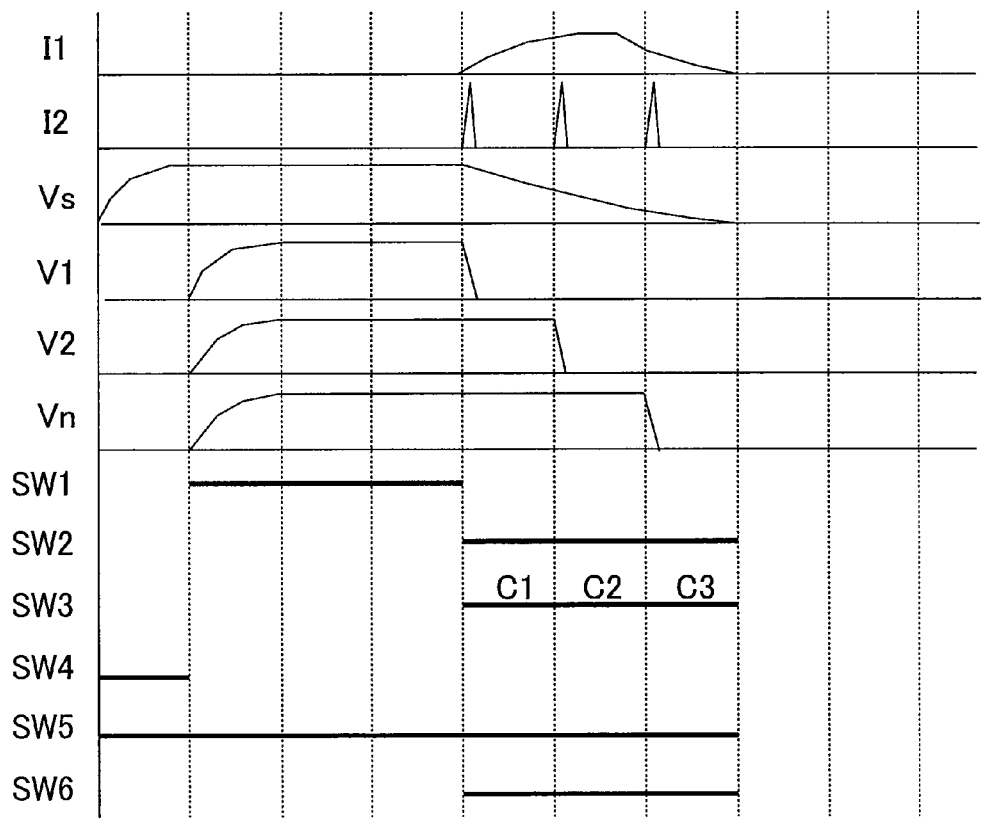
FIG. 12B illustrates an operation thereof.

FIG. 12A is a circuit diagram showing a general configuration of the thermal process apparatus of the present variation, and FIG. 12B illustrates an operation thereof. The present variation is different from the third embodiment shown in FIG. 11A in the configuration of a circuit to which the second group of flash lamps 52 are connected. Referring to FIG. 12A, in the circuit to which the second group of flash lamps 52 are connected in the present variation, the circuit portion including a plurality (N) of condensers C1, C2, ..., Cn and the second group of flash lamps 52 is the same as that of the third embodiment shown in FIG. 11A, but the present variation is different from the third embodiment in that only a switch SW1' is connected in series between the power supply 54 and the condensers C1, C2, ..., Cn. The configuration of the circuit to which the first group of flash lamps 51 are connected in the present variation is the same as that of the third embodiment, and therefore the circuit and the operation thereof will not be described below.

Referring to FIG. 11A, with the circuit to which the second group of flash lamps 52 are connected in the third embodiment, the plurality of condensers C1, C2, ..., Cn can be successively charged by the power supply 54 using the switch SW1 and the switch SW3. In contrast, referring to FIG. 12A, with the circuit to which the second group of flash lamps 52 are connected in the present variation, the plurality of condensers C1, C2, ..., Cn can be charged at once by the power supply 54 using the switch SW1'.

Specifically, when flashing the groups of flash lamps 51 and 52 in the present variation, the switch SW1' is first turned ON to thereby charge the plurality of condensers C1, C2, ...

, Cn at once by the power supply 54, and the switch SW4 and the switch SW5 are turned ON to thereby charge the condenser Cs by the power supply 53, as shown in FIG. 12B. Then, the switch SW4 is turned OFF and the switch SW6 is turned ON, thereby sending the charge from the condenser Cs to the first group of flash lamps 51, thus starting the light emission from the first group of flash lamps 51, i.e., spike RTA. Then, after the switch SW1' is turned OFF, the switch SW2 connected to the second group of flash lamps 52 is turned ON and the switch SW3 is switched from one position to another, thereby sending the charge successively from the condensers C1, C2, ..., Cn to the second group of flash lamps 52. Thus, it is possible to successively perform a number of iterations (equal to the number N of condensers) of millisecond annealing. This successive millisecond annealing operation is performed during a spike RTA process as described above.

With the present variation as described above, it is possible to obtain the effect of improving the productivity by shortening the condenser charging time, in addition to effects similar to those of the third embodiment.

Fourth Embodiment

A thermal process apparatus according to a fourth embodiment of the present invention, more specifically a thermal process apparatus for carrying out the impurity-activating thermal process method of the first and second embodiments, will now be described with reference to the drawings.

Figure 13:
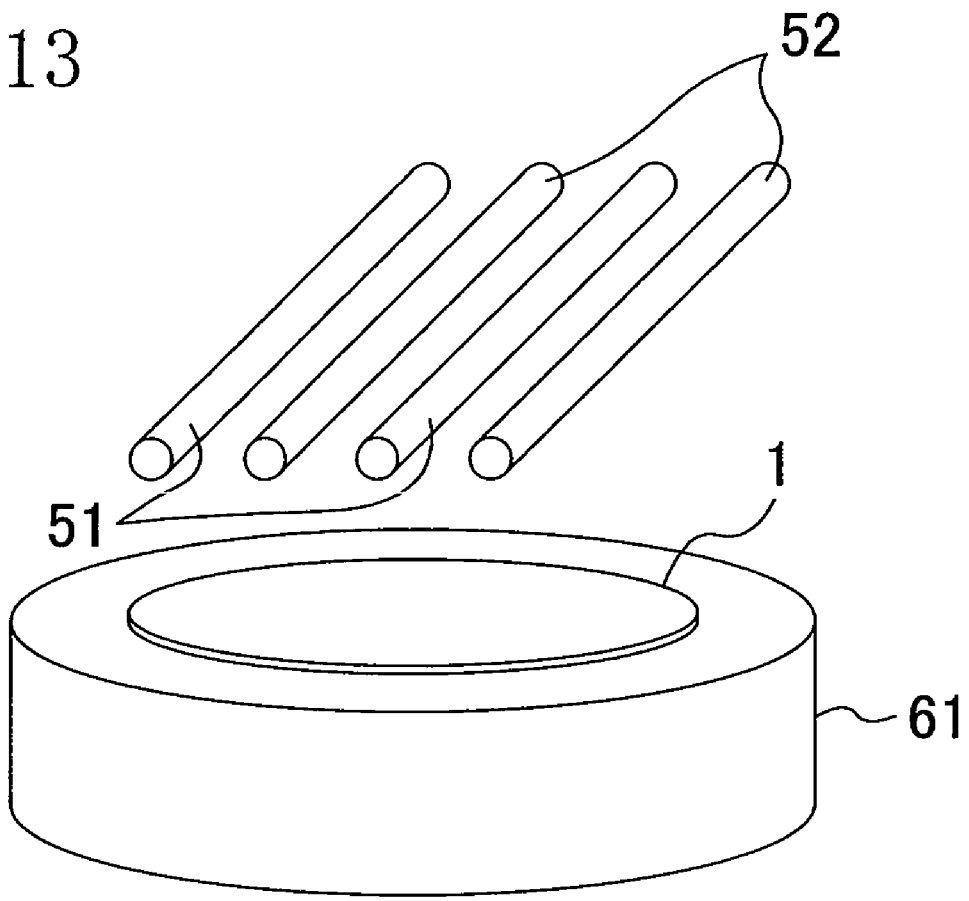
FIG. 13 shows a general configuration of a thermal process apparatus according to a fourth embodiment of the present invention.
Figure 14A:
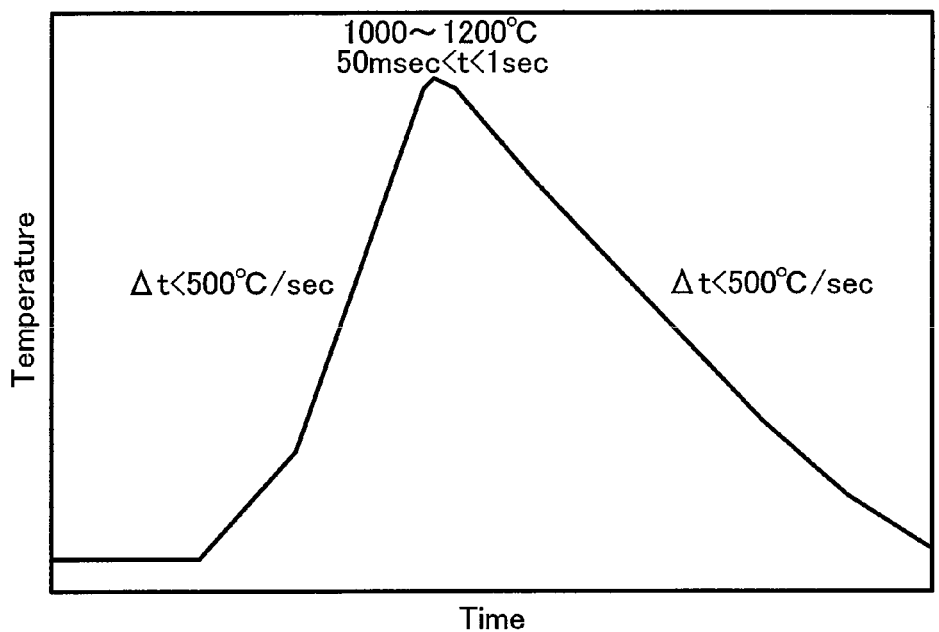
FIG. 14A shows an example of a temperature sequence of a conventional spike RTA.
Figure 14B:
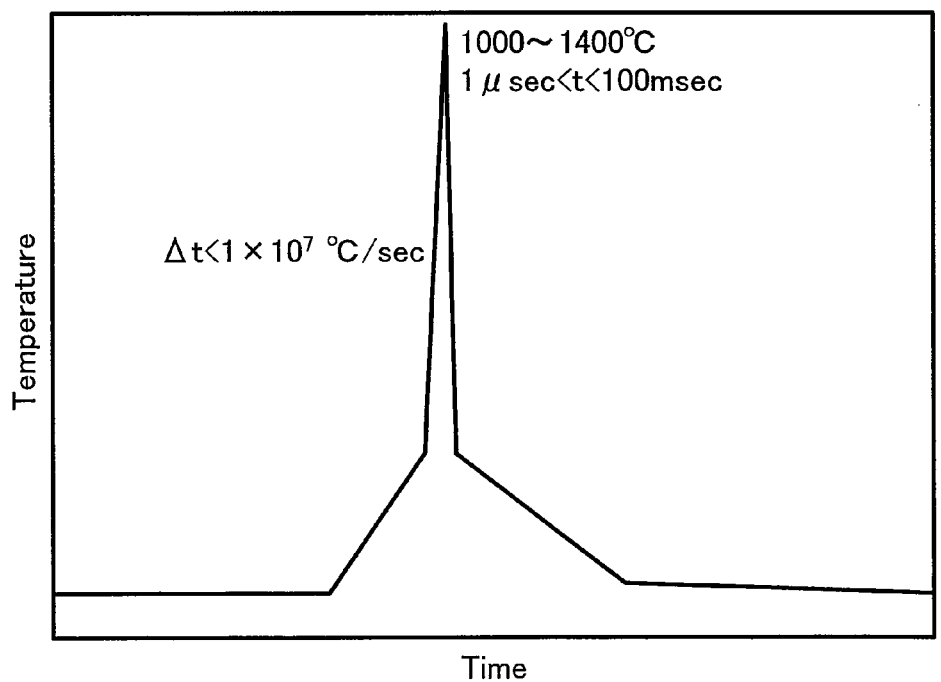
FIG. 14B shows an example of a temperature sequence of a conventional millisecond annealing.

FIG. 13 shows a general configuration of the millisecond annealing apparatus of the present embodiment. As shown in FIG. 13, the thermal process apparatus of the present embodiment includes, within the same chamber (not shown), a hot plate 61 for heating the silicon substrate (silicon wafer) 1, to a first predetermined temperature T1 (° C.) of about 400° C., for example, first flash lamps 51 (for spike RTA) for heating the silicon wafer 1 to a second predetermined temperature T2 (° C.) of about 1000° C., and second flash lamps 52 (for millisecond annealing) for heating the silicon wafer 1 to a third predetermined temperature T3 (° C.) of about 1300° C. The silicon wafer 1 is placed on the hot plate 61. The flash lamps 51 and 52 shown in FIG. 13 correspond to the flash lamps 51 and 52 of the thermal process apparatus of the third embodiment shown in FIG. 11A.

Thus, with the thermal process apparatus of the present embodiment, the impurity-activating thermal process method of the first and second embodiments can be carried out with the silicon wafer 1 left on the hot plate 61.

While spike RTA and millisecond annealing are performed using the flash lamps 51 and 52 in the fourth embodiment, it is possible to obtain similar effects to those of the present embodiment by employing a similar configuration to that of the present embodiment also in a case where spike RTA and millisecond annealing are performed using an arc lamp. A heating mechanism based on optical radiation (e.g., a lamp) may be provided instead of the hot plate 61. In such a case, however, a mechanism for holding the silicon wafer 1 needs to be provided separately.

What is claimed is:

1. An impurity-activating thermal process method of performing an impurity-activating thermal process after a target is subjected to an impurity introduction step, the impurity-activating thermal process comprising the steps of:
(a) performing a preheat treatment from a room temperature to a first predetermined temperature with respect to the target; and
(b), after the step (a), performing spike RTA process and millisecond annealing process simultaneously with respect to the target,
wherein in the step (b), while the spike RTA process including a holding period for holding a temperature at a second predetermined temperature is performed, a plurality of iterations of the millisecond annealing process at a third predetermined temperature higher than the second predetermined temperature are performed during the holding period of the spike RTA process,
the first predetermined temperature is 350° C. to 650° C., both inclusive,
the second predetermined temperature is 1000° C. to 1150° C., both inclusive, and
the third predetermined temperature is 1150° C. to 1400° C., both inclusive.

2. An impurity-activating thermal process method of performing an impurity-activating thermal process after a target is subjected to an impurity introduction step, the impurity-activating thermal process comprising the steps of:
(a) performing a preheat treatment from a room temperature with respect to the target; and
(b), after the step (a), performing spike RTA process and millisecond annealing process simultaneously with respect to the target,
the impurity-activating thermal process including a first thermal cycle, including:
increasing a temperature from an initial temperature which is the room temperature to a first predetermined temperature at an arbitrary temperature-increasing rate by performing the preheat treatment; increasing the temperature from the first predetermined temperature to a second predetermined temperature at a first temperature-increasing rate by performing the spike RTA process; holding the temperature at the second predetermined temperature for a first holding period of 50 msec to 1 sec, both inclusive; decreasing the temperature from the second predetermined temperature to the first predetermined temperature; and decreasing the temperature from the first predetermined temperature to a final temperature; and
a second thermal cycle, including: increasing the temperature from the second predetermined temperature to a third predetermined temperature at a second temperature-increasing rate by performing the millisecond annealing process; holding the temperature at the third predetermined temperature for a second holding period of 1 μsec to 50 msec, both inclusive; and decreasing the temperature from the third predetermined temperature to the second predetermined temperature,
wherein a plurality of iterations of the second thermal cycle are performed during the first holding period of the first thermal cycle for holding the temperature at the second predetermined temperature,
the first predetermined temperature is 350° C. to 650° C., both inclusive,
the second predetermined temperature is 1000° C. to 1150° C., both inclusive and
the third predetermined temperature is 1150° C. to 1400° C., both inclusive.

3. The impurity-activating thermal process method of claim 2, comprising, before performing the first thermal cycle:
forming an isolation region on a silicon substrate being the target; subjecting the silicon substrate to an impurity introduction for threshold control; forming a gate electrode on the silicon substrate with a gate insulating film interposed therebetween; forming an offset spacer on a sidewall of the gate electrode; implanting ions of an impurity into the silicon substrate using the gate electrode and the offset spacer as a mask to thereby form an extension region; performing a first activation thermal process for activating the impurity in the extension region; forming a sidewall spacer on the sidewall of the gate electrode with the offset spacer interposed therebetween; and implanting ions of an impurity into the silicon substrate using the gate electrode, the offset spacer and the sidewall spacer as a mask to thereby form a source/drain region.

4. The impurity-activating thermal process method of claim 2, wherein:

the first temperature-increasing rate is 100° C/sec to 1000° C/sec, both inclusive; and the second temperature-increasing rate is 1000° C/sec to $1.0 \times 10^{7}$° C/sec, both inclusive.

5. The impurity-activating thermal process method of claim 2, wherein:

the first holding period is 50 msec or more; and the second holding period is 1μsec or more.

6. The impurity-activating thermal process method of claim 2, wherein the number of iterations of the second thermal cycle to be performed during the first holding period of the first thermal cycle for holding the temperature at the second predetermined temperature is 5 or less.

* * * * *